US009558937B2

(12) United States Patent
Nakatani et al.

(10) Patent No.: US 9,558,937 B2
(45) Date of Patent: *Jan. 31, 2017

(54) METHOD OF MANUFACTURING SEMICONDUCTOR DEVICE, SUBSTRATE PROCESSING APPARATUS, AND NON-TRANSITORY COMPUTER-READABLE RECORDING MEDIUM

(71) Applicant: HITACHI KOKUSAI ELECTRIC INC., Tokyo (JP)

(72) Inventors: Kimihiko Nakatani, Toyama (JP); Kazuhiro Harada, Toyama (JP); Hiroshi Ashihara, Toyama (JP); Ryuji Yamamoto, Tokyo (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/886,768

(22) Filed: Oct. 19, 2015

(65) Prior Publication Data
US 2016/0042940 A1 Feb. 11, 2016

Related U.S. Application Data

(63) Continuation of application No. 14/499,952, filed on Sep. 29, 2014, now Pat. No. 9,187,826.

(30) Foreign Application Priority Data

Sep. 30, 2013 (JP) ................................ 2013-203717

(51) Int. Cl.
H01L 21/02 (2006.01)
C23C 16/52 (2006.01)
(Continued)

(52) U.S. Cl.
CPC .......... *H01L 21/0228* (2013.01); *C23C 16/06* (2013.01); *C23C 16/14* (2013.01);
(Continued)

(58) Field of Classification Search
CPC ................... C23C 16/45527; C23C 16/45544; C23C 16/45553; C23C 16/52; H01L 21/02142; H01L 21/02175; H01L 21/02205; H01L 21/0228
(Continued)

(56) References Cited

U.S. PATENT DOCUMENTS 5,413,669 A * 5/1995 Fujita ................ H01L 21/32136
257/E21.311
6,335,282 B1 * 1/2002 Sharan .............. H01L 21/28568
257/E21.165
(Continued)

FOREIGN PATENT DOCUMENTS

JP 02-025568 A 1/1990
JP 2003-142425 A 5/2003
(Continued)

Primary Examiner — William F Kraig
Assistant Examiner — Edward Chin
(74) Attorney, Agent, or Firm — Volpe and Koenig, P.C.

(57) ABSTRACT

A method of manufacturing a semiconductor device includes: (a) forming a first film containing a metal element on a substrate by performing a cycle a predetermined number of times, the cycle including: (a-1) supplying a first precursor gas being a fluorine-free inorganic gas containing the metal element to the substrate; and (a-2) supplying a first reactant gas having reducibility to the substrate; (b) forming a second film containing the metal element on the first film by performing a cycle a predetermined number of times, the cycle including: (b-1) supplying a second precursor gas containing the metal element and fluorine to the substrate; and (b-2) supplying a second reactant gas having reducibility to the substrate; and (c) forming a film containing the
(Continued)

metal element and obtained by the first film and the second film being laminated on the substrate by performing the (a) and (b).

20 Claims, 8 Drawing Sheets

(51) Int. Cl.
  *C23C 16/455* (2006.01)
  *H01L 21/28* (2006.01)
  *H01L 21/285* (2006.01)
  *C23C 16/06* (2006.01)
  *C23C 16/14* (2006.01)
  *C23C 16/56* (2006.01)
  *H01L 29/51* (2006.01)
  *H01L 21/768* (2006.01)

(52) U.S. Cl.
  CPC .. *C23C 16/45527* (2013.01); *C23C 16/45544* (2013.01); *C23C 16/45553* (2013.01); *C23C 16/52* (2013.01); *C23C 16/56* (2013.01); *H01L 21/02123* (2013.01); *H01L 21/02172* (2013.01); *H01L 21/02205* (2013.01); *H01L 21/02318* (2013.01); *H01L 21/28079* (2013.01); *H01L 21/28562* (2013.01); *H01L 21/76877* (2013.01); *H01L 29/517* (2013.01)

(58) Field of Classification Search
  USPC .......................................................... 438/761
  See application file for complete search history.

(56) References Cited

U.S. PATENT DOCUMENTS

| | | | |
|---|---|---|---|
| 7,211,508 B2 | 5/2007 | Chung et al. | |
| 2006/0292874 A1* | 12/2006 | Kori | C23C 16/0272 |
| | | | 438/685 |
| 2009/0081866 A1* | 3/2009 | Lee | C23C 16/42 |
| | | | 438/655 |
| 2012/0161218 A1 | 6/2012 | Niitsuma et al. | |
| 2012/0269962 A1 | 10/2012 | Blomberg et al. | |

FOREIGN PATENT DOCUMENTS

| | | |
|---|---|---|
| JP | 2007-523994 A | 8/2007 |
| JP | 2008-060603 A | 3/2008 |
| JP | 2012-151435 A | 8/2012 |
| JP | 2013-508552 A | 3/2013 |
| WO | 03/018868 A1 | 3/2003 |

* cited by examiner

METHOD OF MANUFACTURING SEMICONDUCTOR DEVICE, SUBSTRATE PROCESSING APPARATUS, AND NON-TRANSITORY COMPUTER-READABLE RECORDING MEDIUM

BACKGROUND

Technical Field

The present invention relates to a method of manufacturing a semiconductor device, including a process of forming a thin film on a substrate, a substrate processing apparatus, and a non-transitory computer-readable recording medium.

Related Art

As one of processes of manufacturing a semiconductor device, a process of forming a film containing a metal element on a substrate is performed by alternately performing supplying a precursor gas containing a metal element and fluorine (F) to the substrate and supplying a reactant gas having reducibility to the substrate. For example, a tungsten (W) film can be formed on a substrate by alternately performing supplying hexafluorotungsten ($WF_6$) gas to the substrate and supplying a diborane ($B_2H_6$) gas to the substrate.

SUMMARY

However, when a film containing a metal element is formed by the above-described method, a substrate surface or a thin film being a base of a film formation may be influenced by a ligand of a metal element contained in a precursor gas, that is, F. For example, when a W film is formed by the above-described method, with a silicon (Si)-containing film or a silicon wafer as a base of a film formation, the base of the film formation may be etched by F contained in a $WF_6$ gas. If the base of the film formation is etched, the formed W film is easily peeled off from the base of the film formation. Also, for example, when a W film is formed by the above-described method, with an insulation film such as an aluminum oxide film (AlO film) or a hafnium oxide film (HfO film) as a base of a film formation, F contained in a $WF_6$ gas may be diffused into the insulation film, degrading the insulation property of the insulation film.

An object of the present invention is to reduce the influence to a base of a film formation when a film containing a metal element is formed on a substrate.

According to an aspect of the present invention, there is provided a method of manufacturing a semiconductor device, including: (a) forming a first film containing a metal element on a substrate by performing a cycle a predetermined number of times, the cycle including: (a-1) supplying a first precursor gas being a fluorine-free inorganic gas containing the metal element to the substrate; and (a-2) supplying a first reactant gas having reducibility to the substrate; (b) forming a second film containing the metal element on the first film by performing a cycle a predetermined number of times, the cycle including: (b-1) supplying a second precursor gas containing the metal element and fluorine to the substrate; and (b-2) supplying a second reactant gas having reducibility to the substrate; and (c) forming a film containing the metal element and obtained by the first film and the second film being laminated on the substrate by performing the (a) and (b).

According to the present invention, when a film containing a metal element is formed on a substrate, it is possible to reduce the influence to a base of a film formation.

DETAILED DESCRIPTION

Embodiment of Present Invention

Hereinafter, an embodiment of the present invention will be described with reference to FIGS. 1 to 3.

(1) Configuration of Substrate Processing Apparatus

Figure 1:
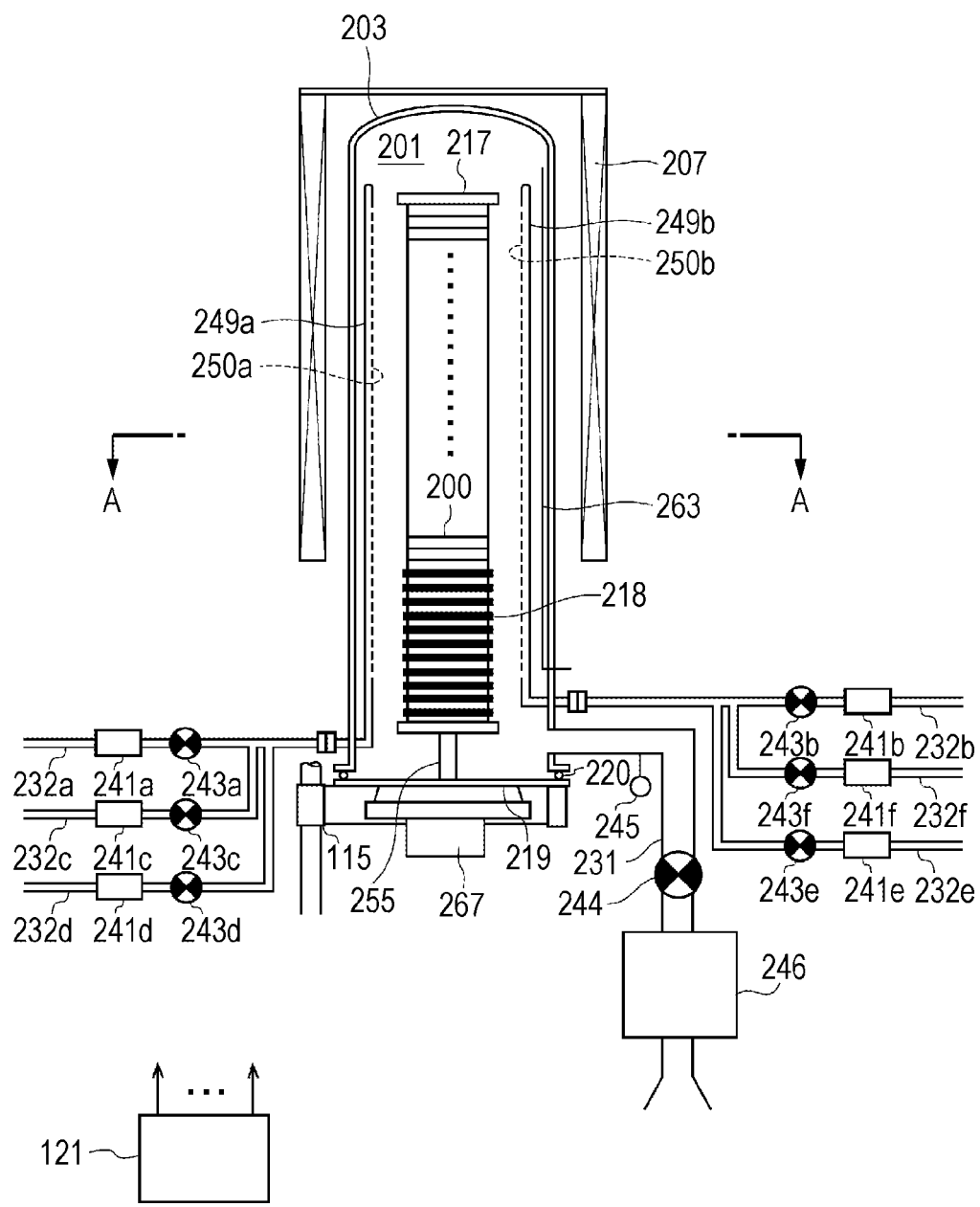
FIG. 1 is a schematic configuration diagram of a vertical processing furnace of a substrate processing apparatus suitably used in an embodiment of the present invention and a longitudinal sectional view of a processing furnace part.
Figure 2:
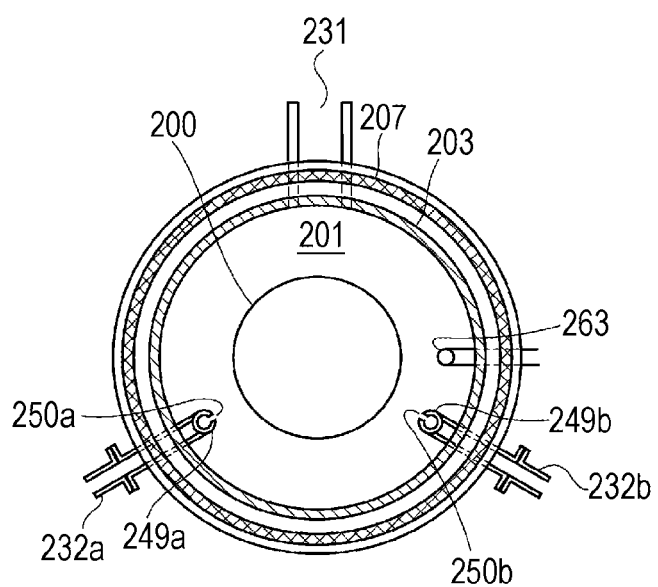
FIG. 2 is a schematic configuration diagram of the vertical processing furnace of the substrate processing apparatus suitably used in the embodiment of the present invention and a sectional view of the processing furnace part, taken along line A-A of FIG. 1.

As illustrated in FIG. 1, a processing furnace 202 includes a heater 207 as a heating unit (heating mechanism). The heater 207 has a cylindrical shape and is vertically installed by being supported to a heater base (not illustrated) as a holding plate. As described below, the heater 207 functions as an activation mechanism (excitation unit) that activates (excite) gas to heat.

Inside the heater 207, a reaction tube 203 is disposed to configure a reaction vessel (processing vessel) that is coaxial to the heater 207. The reaction tube 203 is made of a heat resistant material, such as quartz ($SiO_2$) or silicon carbide (SiC), and is formed to have a cylindrical shape with a closed upper end and an opened lower end. A process chamber 201 is formed in a cylindrical hollow portion of the reaction tube 203 and is configured such that wafers 200 as substrates can be accommodated in a state of being vertically arranged in a horizontal posture in multiple stages by a boat 217 to be described below.

Inside the process chamber 201, nozzles 249a and 249b are provided to pass through a lower part of the reaction tube 203. Gas supply pipes 232a and 232b are connected to the nozzles 249a and 249b, respectively. A gas supply pipe 232c is connected to the gas supply pipe 232a. A gas supply pipe 232f is connected to the gas supply pipe 232b. As such, the two nozzles 249a and 249b and the four gas supply pipes 232a to 232c and 232f are provided in the reaction tube 203 and are configured such that a plurality of types of gases, herein, four types of gases, can be supplied into the process chamber 201.

However, the processing furnace 202 according to the present embodiment is not limited to the above example. For example, a metal manifold may be provided below the reaction tube 203 so as to support the reaction tube 203, and each nozzle may be provided to pass through a sidewall of the manifold. In this case, an exhaust pipe 231 to be described below may be further provided in the manifold. Even in this case, the exhaust pipe 231 may be provided not in the manifold but at the lower part of the reaction tube 203. In this way, a furnace throat portion of the processing furnace 202 may be made of a metal, and nozzles or the like may be attached to the metal furnace throat portion.

In order from an upstream direction, mass flow controllers (MFCs) 241a to 241c and 241f being flow rate controllers (flow rate control unit) and valves 243a to 243c and 243f being on-off valves are provided in the gas supply pipes 232a to 232c and 232f, respectively. On the downstream side of the valves 243a and 243b of the gas supply pipes 232a and 232b, gas supply pipes 232d and 232e are connected to supply an inert gas. In order from an upstream direction, MFCs 241d and 241e being flow rate controllers (flow rate control unit) and valves 243d and 243e being on-off valves are provided in the gas supply pipes 232d and 232e, respectively.

The nozzles 249a and 249b are connected to front ends of the gas supply pipes 232a and 232b, respectively. As illustrated in FIG. 2, the nozzles 249a and 249b are provided to rise toward an upward portion in a stacking direction of the wafer 200 in an annular space between an inner wall of the reaction tube 203 and the wafer 200, along an upper part from a lower part of the inner wall of the reaction tube 203. That is, the nozzles 249a and 249b are provided along a wafer arrangement region in a region horizontally surrounding the wafer arrangement region on a side of the wafer arrangement area in which the wafer 200 is arranged. The nozzles 249a and 249b are configured as L-shaped long nozzles, respectively. In the nozzles 249a and 249b, horizontal portions are provided to pass through a lower sidewall of the reaction tube 203, and vertical portions are provided to rise from one end to the other end of at least the wafer arrangement region. Gas supply holes 250a and 250b configured to supply gas are provided in side surfaces of the nozzles 249a and 249b, respectively. The gas supply holes 250a and 250b are opened toward the center of the reaction tube 203 and enable the supplying of gas toward the wafer 200. The gas supply holes 250a and 250b are provided with a plurality of holes across the upper part from the lower part of the reaction tube 203, have the same opening area, and are provided at the same opening pitch.

As such, in the present embodiment, gas is carried through the nozzles 249a and 249b disposed in the space longitudinally extending in an annular shape defined by the inner wall of the reaction tube 203 and the end portions (outer periphery) of the plurality of stacked wafers 200, that is, in the cylindrical space. Gas is ejected from the gas supply holes 250a and 250b, which are respectively opened in the nozzles 249a and 249b, to the reaction tube 203 for the first time in the vicinity of the wafer 200. A main flow of gas in the reaction tube 203 is a direction parallel to the surface of the wafer 200, that is, a horizontal direction. Due to such a configuration, gas can be uniformly supplied to each wafer 200, and the thickness of a thin film formed in each wafer 200 can be made uniform. Gas flowing on the surface of the wafer 200, that is, gas remaining after reaction, flows in a direction of the exhaust port, that is, the exhaust pipe 231 to be described below. However, the direction of the flow of the residual gas is appropriately specified according to the position of the exhaust port and is not limited to a vertical direction.

As a first precursor gas being a fluorine-free (F-free) inorganic gas containing a metal element, for example, a chlorotungsten-based precursor gas containing tungsten (W) as a predetermined element and chlorine (Cl) as a halogen element is supplied from the gas supply pipe 232a into the process chamber 201 through the MFC 241a, the valve 243a, and the nozzle 249a.

The chlorotungsten-based precursor gas is a chlorotungsten-based precursor of a gaseous state, for example, gas obtained by vaporizing a chlorotungsten-based precursor that is a solid state or a liquid state under normal temperature and normal pressure, or a chlorotungsten-based precursor that is a gaseous state under normal temperature and normal pressure. The chlorotungsten-based precursor is a tungsten-based precursor having a chloro group as a halogen group and is a precursor containing at least W and Cl. The chlorotungsten-based precursor is also referred to as a type of a halide. A case where the term "precursor" is used in this specification is a case that means a "solid precursor of a solid state", a case that means a "liquid precursor of a liquid state", a case that means a "precursor gas of a gaseous state", or a case that means all of them. Therefore, a case where the term "chlorotungsten-based precursor" is used in this specification is a case that means a "chlorotungsten-based precursor of a solid state", a case that means a "chlorotungsten-based precursor of a liquid state", a case that means a "chlorotungsten-based precursor gas of a gaseous state", or a case that means all of them. It is preferable to use an F-free inorganic gas containing W, that is, gas containing W and containing neither F nor carbon (C), as the chlorotungsten-based precursor gas. For example, hexachlorotungsten ($WCl_6$) can be preferably used. In the case of using a solid precursor, such as $WCl_6$, which is a solid state under normal temperature and normal pressure, for example, a liquefied precursor liquefied by dissolving the solid precursor in a solvent is vaporized by a vaporization system, such as a vaporizer or a vibrator, and is supplied as a chlorotungsten-based precursor gas ($WCl_6$ gas).

As a first reactant gas and a second reactant gas having reducibility, for example, diborane ($B_2H_6$, abbreviated to DB) being a hydrogen-containing gas is supplied from the gas supply pipe 232b into the process chamber 201 through the MFC 241b, the valve 243b, and the nozzle 249b. The $B_2H_6$ gas is used as a first reactant gas in a first W film forming process to be described below and second reactant gas in a second W film forming process to be described below. That is, in the present embodiment, the same gas, $B_2H_6$ gas, that is, gas having the same chemical structure, is used as the first reactant gas and the second reactant gas.

However, the present embodiment is not limited to the above example. For example, different gases, that is, gases having different chemical structures, may be used as the first reactant gas and the second reactant gas. In this case, in the first W film forming process, for example, the first reactant gas is supplied from the gas supply pipe 232b, and in the second W film forming process, for example, the second reactant gas is supplied from the gas supply pipe 232f. The gas supplied from the gas supply pipe 232f is supplied into the process chamber 201 through the MFC 241f, the valve 243f, the gas supply pipe 232b, and the nozzle 249b.

As second precursor gas containing a metal element and fluorine (F), for example, fluorotungsten-based precursor gas containing tungsten (W) as a predetermined element and fluorine (F) as a halogen element is supplied from the gas supply pipe 232c into the process chamber 201 through the MFC 241c, the valve 243c, the gas supply pipe 232a, and the nozzle 249a.

The fluorotungsten-based precursor gas is a fluorotungsten-based precursor of a gaseous state, for example, gas obtained by vaporizing a fluorotungsten-based precursor that is a liquid state under normal temperature and normal pressure, or a fluorotungsten-based precursor that is a gaseous state under normal temperature and normal pressure. The fluorotungsten-based precursor is a tungsten-based precursor having a fluoro group as a halogen group and is a precursor containing at least W and F. The fluorotungsten-based precursor is also referred to as a type of a halide. A case where the term "fluorotungsten-based precursor" is used in this specification is a case that means a "fluorotungsten-based precursor of a liquid state", a case that means a "fluorotungsten-based precursor gas of a gaseous state", or a case that means both of them. It is preferable to use an inorganic gas containing W and F, that is, a C-free gas containing W and F, as the fluorotungsten-based precursor gas. For example, hexafluorotungsten ($WF_6$) can be preferably used. In the case of using a gaseous precursor, such as $WF_6$, which is a gaseous state under normal temperature and normal pressure, for example, $WF_6$ can be supplied as the fluorotungsten-based gas ($WF_6$ gas), without being vaporized by a vaporization system, such as a vaporizer or a vibrator. On the other hand, in the case of using a fluorotungsten-based precursor which is a liquid state under normal temperature and normal pressure, the fluorotungsten-based precursor of the liquid state is vaporized by a vaporization system, such as a vaporizer or a vibrator, and is supplied as the fluorotungsten-based gas.

As an inert gas, for example, a nitrogen ($N_2$)-containing gas is supplied from the gas supply pipes 232d and 232e into the process chamber 201 through the MFCs 241d and 241e, the valves 243d and 243e, the gas supply pipes 232a and 232b, and the nozzles 249a and 249b, respectively.

In a case where the gases flow from the respective gas supply pipes as described above, a first precursor gas supply system that supplies the first precursor gas being the F-free inorganic gas containing the metal element, that is, a chlorotungsten-based precursor gas supply system, is configured by, mainly, the gas supply pipes 232a, the MFC 241a, and the valve 243a. The nozzle 249a may be included in the chlorotungsten-based precursor gas supply system. The first precursor gas supply system may also be referred to as a first precursor supply system, and the chlorotungsten-based precursor gas supply system may also be referred to as a chlorotungsten-based precursor supply system.

Also, a first reactant gas supply system that supplies the first reactant gas having reducibility and a second reactant gas supply system that supplies the second reactant gas having reducibility are configured by, mainly, the gas supply pipes 232b, the MFC 241b, and the valve 243b. The first reactant gas supply system and the second reactant gas supply system are configured as reducing gas supply systems (hydrogen-containing gas supply systems), respectively. The nozzle 249b may be included in each of the first reactant gas supply system and the second reactant gas supply system. In the present embodiment, since the same gas, $B_2H_6$ gas, is used as the first reactant gas and the second reactant gas, the first reactant gas supply system and the second reactant gas supply system are configured by the same gas supply system.

However, the present embodiment is not limited to the above example. As described above, different gases may be used as the first reactant gas and the second reactant gas. In this case, the first reactant gas supply system and the second reactant gas supply system are configured by different gas supply systems, respectively. For example, the first reactant gas supply system is configured by, mainly, the gas supply pipe 232b, the MFC 241b, and the valve 243b. Also, for example, the second reactant gas supply system is configured by, mainly, the gas supply pipe 232f, the MFC 241f, and the valve 243f. Even in this case, the nozzle 249b may be included in each of the first reactant gas supply system and the second reactant gas supply system. Also, a downstream side of a portion connected to the gas supply pipe 232f in the nozzle 249b and the gas supply pipe 232b may be included in the second reactant gas supply system.

Also, a second precursor gas supply system that supplies the second precursor gas containing the metal element and F, that is, a fluorotungsten-based precursor gas supply system, is configured by, mainly, the gas supply pipes 232c, the MFC 241c, and the valve 243c. A downstream side of a portion connected to the gas supply pipe 232c in the gas supply pipe 232a and the nozzle 249a may be included in the fluorotungsten-based precursor gas supply system. The second precursor gas supply system may also be referred to as a second precursor supply system, and the fluorotungsten-based precursor gas supply system may also be referred to as a fluorotungsten-based precursor supply system.

Also, an inert gas supply system is configured by, mainly, the gas supply pipes 232d and 232e, the MFCs 241d and 241e, and the valves 243d and 243e. Nozzles 249a and 249b, at downstream side of portions connected to the gas supply pipes 232d and 232e in the gas supply pipes 232a and 232b may be included in the inert gas supply system. The inert gas supply system also functions as a purge gas supply system.

The first precursor gas and the second precursor gas can also be simply referred to as precursor gas. In this case, the precursor gas supply system is configured by the first precursor gas supply system and the second precursor gas supply system. The precursor gas supply system can also be referred to as a precursor supply system. Also, the first reactant gas and the second reactant gas can also be simply referred to as reactant gas. In this case, the reactant gas supply system is configured by the first reactant gas supply system and the second reactant gas supply system. The reactant gas supply system can also be referred to as a reducing gas supply system (hydrogen-containing gas supply system).

Inside the reaction tube 203, an exhaust pipe 231 is provided to exhaust an atmosphere inside the process chamber 201. In the exhaust pipe 231, a vacuum pump 246 as a vacuum exhaust device is connected through a pressure sensor 245 as a pressure detector (pressure detection unit), which detects a pressure inside the process chamber 201, and an auto pressure controller (APC) valve 244 as a pressure regulator (pressure regulation unit). The APC valve 244 is a valve configured to perform vacuum exhaust or a vacuum exhaust stop to the process chamber 201 by opening or closing a valve in a state in which the vacuum pump 246 is operated, and to adjust a pressure inside the process chamber 201 by adjusting the degree of valve opening, based on pressure information detected by the pressure sensor 245 in a state in which the vacuum pump 246. An exhaust system is configured by, mainly, the exhaust pipe 231, the APC valve 244, and the pressure sensor 245. The vacuum pump 246 may be included in the exhaust system.

Below the reaction tube 203, a seal cap 219 is provided as a throat lid that can airtightly close a lower end opening of the reaction tube 203. The seal cap 219 is configured to be brought into contact with a lower end of the reaction tube 203 from a vertically lower side. The seal cap 219 is made of a metal such as a stainless steel (SUS) and is formed to have a disk shape. On the top surface of the seal cap 219, an O-ring 220 is provided as a seal member that comes into contact with the lower end of the reaction tube 203. On a side of the seal cap 219 opposite to the process chamber 201, a rotation mechanism 267 is installed to rotate a boat 217 to be described below. A rotational shaft 255 of the rotation mechanism 267 passes through the seal cap 219 and is connected to the boat 217. The rotation mechanism 267 is configured to rotate the wafer 200 by rotating the boat 217. The seal cap 219 is configured to be vertically elevated by a boat elevator 115 as an elevation mechanism that is vertically provided outside the reaction tube 203. The boat elevator 115 is configured to load the boat 217 into the process chamber 201 and unload the boat 217 from the process chamber 201 by elevating the seal cap 219. The boat elevator 115 is configured as a transfer device (transfer mechanism) that transfers the boat 217, that is, the wafer 200, to the inside or the outside of the process chamber 201.

The boat 217 as a substrate support is configured such that a plurality of wafers, for example, 100 to 200 wafers 200, are vertically supported in a horizontal posture, with their centers aligned with one another, in multiple stages, that is, arranged spaced apart from one another. The boat 217 is made of, for example, a heat resistant material such as quartz or SiC. At the lower part of the boat 217, a heat insulation plate 218 made of, for example, a heat resistant material such as quartz or SiC, is configured to be supported in a horizontal posture in multiple stages, so that heat from the heater 207 is hardly transmitted to the seal cap 219 side. However, the present embodiment is not limited to the above example. For example, instead of providing the heat insulation plate 218 at the lower part of the boat 217, a heat insulation cylinder configured as a cylindrical member made of a heat resistant material such as quart or SiC may be provided.

Inside the reaction tube 203, a temperature sensor 263 is installed as a temperature detector. An energization state of the heater 207 is adjusted based on temperature information detected by the temperature sensor 263, so that a temperature inside the process chamber 201 has a desired temperature distribution. Similar to the nozzles 249a and 249b, the temperature sensor 263 is configured to have an L shape and is provided along the inner wall of the reaction tube 203.

Figure 3:
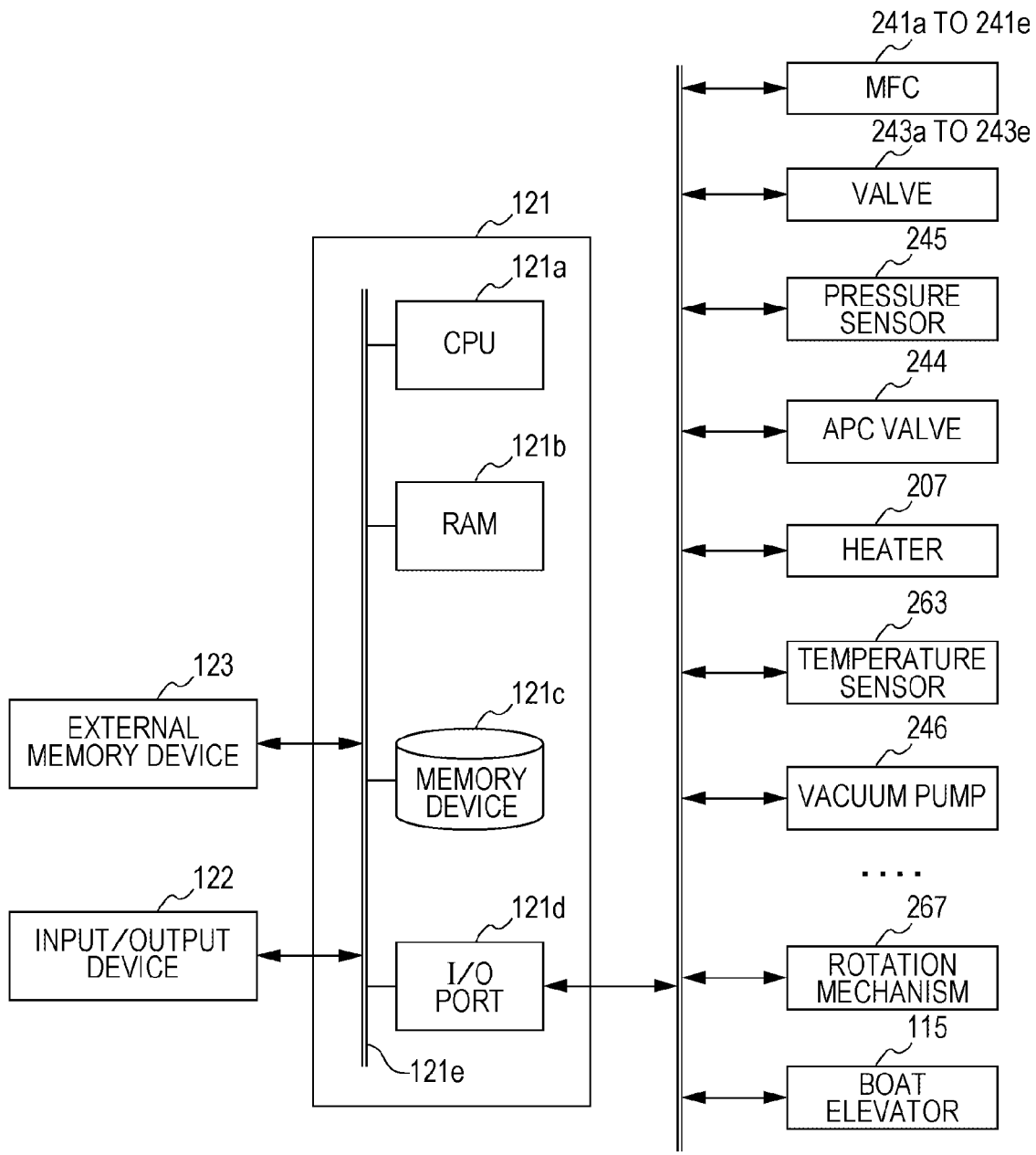
FIG. 3 is a schematic configuration diagram of a controller of the substrate processing apparatus suitably used in the embodiment of the present invention and a block diagram of a control system of the controller.

As illustrated in FIG. 3, a controller 121 being a control unit (control device) is configured by a computer that includes a central processing unit (CPU) 121a, random access memory (RAM) 121b, a memory device 121c, and an I/O port 121d. The RAM 121b, the memory device 121c, and the I/O port 121d are configured to exchange data with the CPU 121a through an internal bus 121e. An input/output device 122 configured by, for example, a touch panel, is connected to the controller 121.

The memory device 121c is configured by, for example, flash memory or a hard disk drive (HDD). A program for controlling the operation of the substrate processing apparatus or a process recipe in which a substrate processing sequence or a condition to be described below is readably recorded in the memory device 121c. The process recipe is a combination that can obtain a desired result by causing the controller 121 to perform the respective procedures of the substrate processing to be described below and functions as a program. Hereinafter, the process recipe or the control program will be simply collectively referred to as a program. A case where the term "program" is used in this specification is a case that includes only the process recipe, a case that includes only the control program, or a case that includes both of them. The RAM 121b is configured as a memory area (work area) that temporarily holds a program or data read by the CPU 121a.

The I/O port 121d is connected to the MFCs 241a to 241e, the valves 243a to 243e, the pressure sensor 245, the APC valve 244, the vacuum pump 246, the heater 207, the temperature sensor 263, the rotation mechanism 267, and the boat elevator 115.

The CPU 121a is configured to read and execute the control program from the memory device 121c and read the process recipe from the memory device 121c according to an input of an operation command from the input/output device 122. The CPU 121a is configured to control the operation of adjusting the flow rates of various gases by the MFCs 241a to 241e, the operation of opening/closing the valves 243a to 243e, the operation of opening/closing the APC valve 244, the operation of adjusting the pressure by the APC valve 244 based on the pressure sensor 245, the start and stop of the vacuum pump 246, the operation of adjusting the temperature of the heater 207 based on the temperature sensor 263, the operation of adjusting the rotation and rotating speed of the boat 217 by the rotation mechanism 267, and the operation of elevating the boat 217 by the boat elevator 115, so as to conform to the contents of the read process recipe.

The controller 121 is not limited to the case that is configured as a dedicated computer, and may be configured as a general-purpose computer. For example, the controller 121 according to the present embodiment can be configured by preparing an external memory device (for example, a magnetic tape, a magnetic disk such as a flexible disk or a hard disk, an optical disk such as a CD or a DVD, a magneto-optical disk such as an MO, or semiconductor memory such as a USB or a memory card) 123, which stores the above-described program, and installing the program on a general-purpose computer by using the relevant external memory device 123. However, a unit for providing the program to the computer is not limited to a case that supplies the program through the external memory device 123. For example, the program may be provided through the external memory device 123 through a communication unit such as the Internet or a private line. The memory device 121c or the external memory device 123 is configured as a non-transitory computer-readable recording medium storing a program. Hereinafter, these will be simply collectively referred to as a non-transitory computer-readable recording medium. A case where the term "non-transitory computer-readable recording medium" is used in this specification is a case that includes only the memory device 121c, a case that includes only the external memory device 123, or a case that includes both of them.

(2) Substrate Processing

Next, as one of processes of manufacturing a semiconductor device, a sequence example of forming a film on a substrate by using the processing furnace of the above-described substrate processing apparatus will be described. In the following description, the operations of the respective units constituting the substrate processing apparatus are controlled by the controller 121.

The film-forming sequence of the present embodiment includes: (a) forming a first film containing a metal element on a substrate by performing a cycle a predetermined number of times, the cycle including: (a-1) supplying a first precursor gas being a fluorine-free inorganic gas containing the metal element to the substrate; and (a-2) supplying a first reactant gas having reducibility to the substrate; (b) forming a second film containing the metal element on the first film by performing a cycle a predetermined number of times, the cycle including: (b-1) supplying a second precursor gas containing the metal element and fluorine to the substrate; and (b-2) supplying a second reactant gas having reducibility to the substrate; and (c) forming a film containing the metal element and obtained by the first film and the second film being laminated on the substrate by performing the (a) and (b).

Also, "the process of performing a cycle a predetermined number of times, the cycle including: supplying the precursor gas; and supplying the reactant gas" means that the cycle is performed once or more, when the cycle of performing the process of supplying the precursor gas and the process of supplying the reactant gas alternately or simultaneously is 1 cycle. That is, it means that the cycle is performed once or more. In other words, it means that the cycle of performing the process of supplying the precursor gas and the process of supplying the reactant gas alternately or simultaneously is performed once or is repeated twice or more. However, it is preferable that the cycle is repeated twice or more.

Also, the "film containing the metal element" means a film made of a conductive material including a metal element. Herein, the film containing the metal element includes a film essentially consisting of a metal element, that is, a film containing a metal element as a main component. Also, besides the film essentially consisting of the metal element, the "film containing the metal element" includes a conductive metal nitride film, a conductive metal oxide film, a conductive metal oxynitride film, a conductive metal composite film, a conductive metal alloy film, a conductive metal silicide film, a conductive metal carbide film, and the like. These may be simply collectively referred to as a metal film.

Hereinafter, the film-forming sequence of the present embodiment will be described with reference to FIGS. 4 to 5A.

Figure 4:
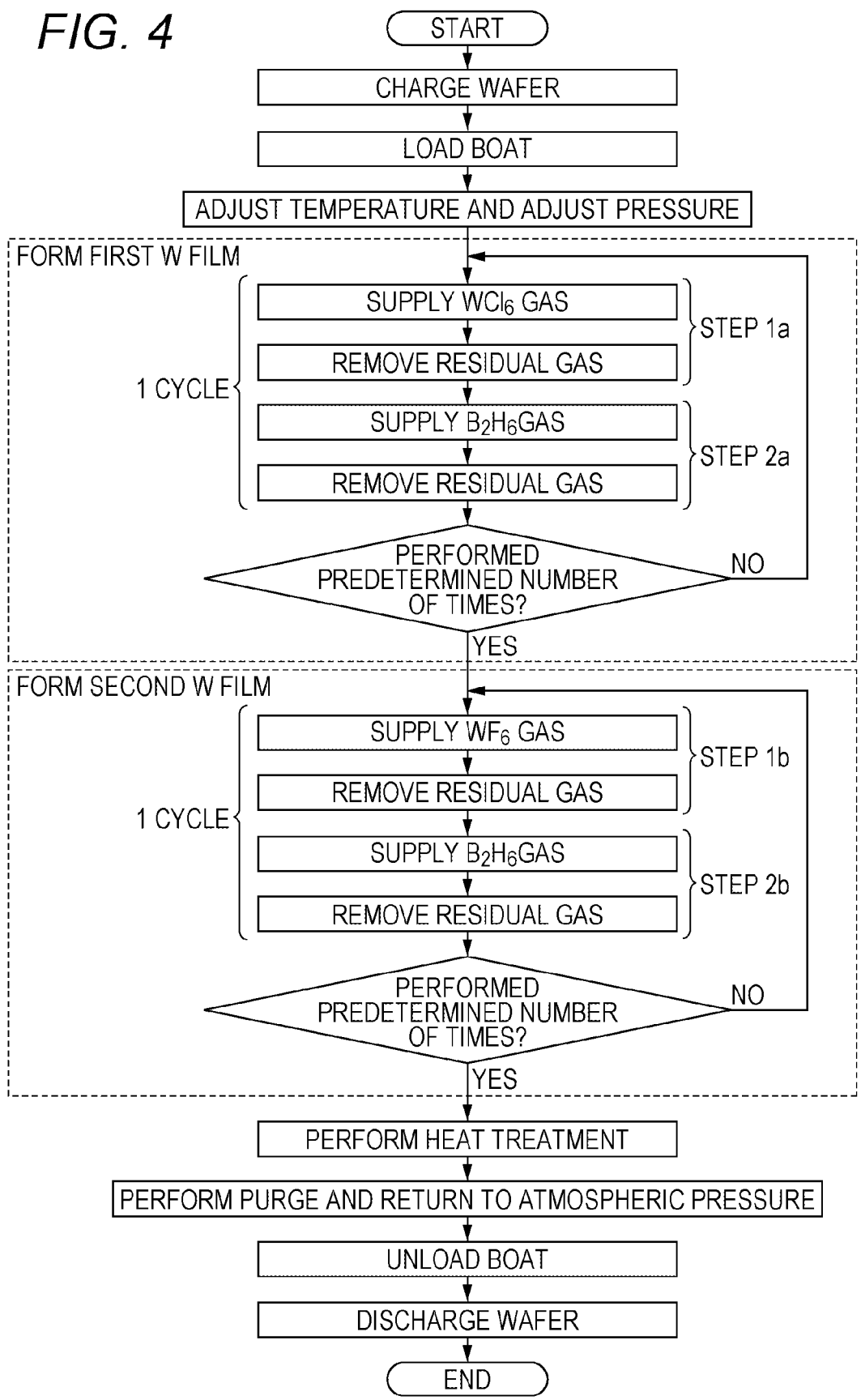
FIG. 4 is a diagram illustrating a film-forming flow of a film-forming sequence according to an embodiment of the present invention.
Figure 5A:
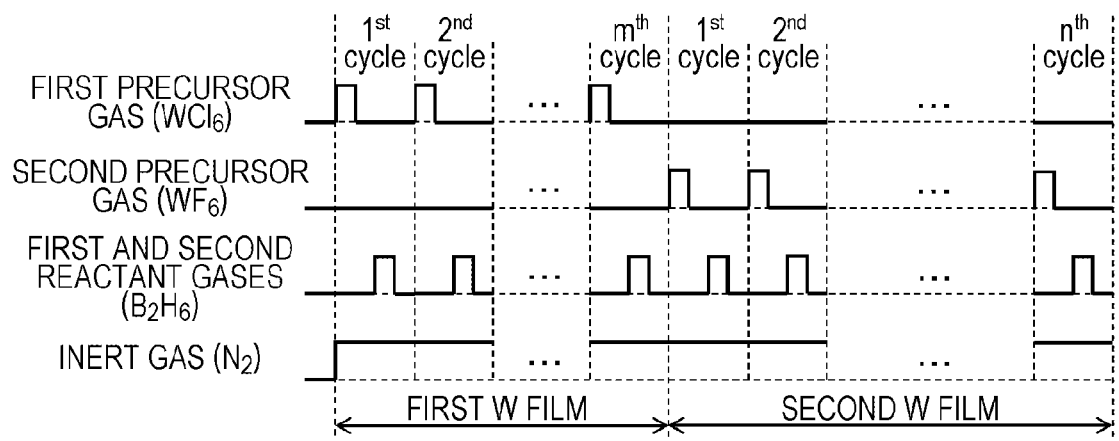
FIG. 5A is a diagram illustrating a timing of gas supply in the film-forming sequence according to an embodiment of the present invention.

The film-forming sequence illustrated in FIGS. 4 and 5A includes: (a) forming a first film (first W film) containing W on a wafer 200 by performing a cycle a predetermined number of times, the cycle including: (a-1) supplying $WCl_6$ as a first precursor gas being an F-free inorganic gas containing W to the wafer 200; and (a-2) supplying $B_2H_6$ as a first reactant gas having reducibility to the wafer 200; (b) forming a second film (second W film) containing W on the first film by performing a cycle a predetermined number of times, the cycle including: (b-1) supplying $WF_6$ as a second precursor gas containing W and F to the wafer 200; and (b-2) supplying $B_2H_6$ as a second reactant gas having reducibility to the wafer 200; and (c) forming a film (W film) containing W and obtained by the first film (first W film) and the second film (second W film) being laminated on the wafer 200 by performing the (a) and (b).

FIGS. 4 and 5A are an example that forms the first W film by alternately performing the process of supplying the first precursor gas and the process of supplying the first reactant gas a predetermined number of times (m times), and forms the second W film by alternately performing the process of supplying the second precursor gas and the process of supplying the second reactant gas a predetermined number of times (n times).

Each of the first W film and the second W film is a film essentially consisting of W, that is, a film containing W as a main component. Also, the W film obtained by the first W film and the second W film being laminated is also a film essentially consisting of W, that is, a film containing W as a main component. Also, each of a first W layer and a second W layer to be described below is also a layer essentially consisting of W, that is, a layer containing W as a main component. In this specification, the expression "film (or layer) essentially consisting of W" can be read as "film (or layer) containing W as a main component". This is equally applied to other embodiments or modifications to be described below.

A case where the term "wafer" is used in this specification is a case that means a "wafer itself", or a case that means a "laminate (aggregate) of a predetermined film or layer formed on a surface of a wafer", that is, a case that is referred to as a wafer including a predetermined layer or film formed on a surface. Also, a case where the term "surface of a wafer" is used in this specification is a case that means a "surface (exposed surface) of a wafer itself", or a case that means a "surface of a predetermined layer or film formed on a wafer, that is, an outermost surface of a wafer as a laminate".

Therefore, a case where the expression "predetermined gas is supplied to a wafer" is described in this specification is a case that means "predetermined gas is directly supplied to a surface (exposed surface) of a wafer itself", or a case that means "predetermined gas is supplied to a predetermined layer or film formed on a wafer, that is, an outermost surface of a wafer as a laminate". Also, a case where the expression "predetermined layer (or film) is formed a wafer" is described in this specification is a case that means "layer (or film) is directly formed on a surface (exposed surface) of a wafer itself", or a case that means "predetermined layer (or film) is formed on a layer or film formed on a wafer, that is, an outermost surface of a wafer as a laminate".

A case where the term "substrate" is used in this specification is the same as the case where the term "wafer" is used. In that case, in the above description, it may be considered that "wafer" is replaced with "substrate".

(Wafer Charging and Boat Loading)

When the plurality of wafers 200 is charged into the boat 217 (wafer charging), as illustrated in FIG. 1, the boat 217 supporting the plurality of wafers 200 is moved upward by the boat elevator 115 and is loaded into the process chamber 201 (boat loading). In this state, the seal cap 219 is in a state of sealing the lower end of the reaction tube 203 through the O-ring 220.

On the surface of the wafer 200, for example, a Si-containing film, such as a silicon film (Si film), a silicon oxide film (SiO film), a silicon nitride film (SiN film), a silicon carbide film (SiC film), a silicon carbonitride film (SiCN film), a silicon oxynitride film (SiON film), a silicon oxycarbide film (SiOC film), and a silicon oxycarbonitride film (SiOCN film), or a metal oxide film, that is, a high-dielectric-constant insulating film (high-k film), such as an aluminum oxide film (AlO film), a hafnium oxide film (HfO film), a zirconium oxide film (ZrO film), and a titanium oxide (TiO film), or a metal nitride film such as a titanium nitride film (TiN film), is formed in advance. Also, for example, on the surface of the wafer 200, a film in which these films are laminated, for example, a film (TiN/AlO, TiN/HfO, TiN/ZrO) in which the TiN film is laminated on the AlO film, the HfO film, or the ZrO film, may be formed in advance. In the first W film forming process to be described below, these films are at least a part of a base film when the first W film is formed. Also, these films are at least a part of a base film when a W film is formed by laminating the first W film and the second W film. The oxide film (or, the oxynitride film, the oxycarbide film, the oxycarbonitride film) used herein includes not only an oxide film intentionally formed by performing a predetermined process such as a thermal oxidation process or a plasma oxidation process, but also a natural oxide film naturally formed by exposure to the atmosphere during transfer.

(Pressure Adjustment and Temperature Adjustment)

The pressure inside the process chamber 201, that is, the pressure of the space where the wafer 200 exists, is vacuum-exhausted to a desired pressure (degree of vacuum) by the vacuum pump 246. At this time, the pressure inside the process chamber 201 is measured by the pressure sensor 245, and the APC valve 244 is feedback-controlled based on the measured pressure information (pressure adjustment). The vacuum pump 246 maintains the always operated state until the processing on at least the wafer 200 is completed. Also, the wafer in the process chamber 201 is heated by the heater 207 until the wafer 200 has a desired temperature. At this time, the energization state of the heater 207 is feedback-controlled based on the temperature information detected by the temperature sensor 263, such that the inside of the process chamber 201 has a desired temperature distribution (temperature adjustment). The heating of the inside of the process chamber 201 by the heater 207 is continuously performed until the processing on at least the wafer 200 is completed. Subsequently, the rotation of the boat 217 and the wafer 200 is started by the rotation mechanism 267. The rotation of the boat 217 and the wafer 200 by the rotation mechanism is continuously performed at least until the processing on the wafer 200 is completed.

(First W Film Forming Process) After that, the following two steps, that is, steps 1a and 2a, are sequentially performed.

(Step 1a)

(Supplying of $WCl_6$ Gas)

The valve 243a is opened and $WCl_6$ gas is made to flow to the gas supply pipe 232a. The flow rate of the $WCl_6$ gas is adjusted by the MFC 241a, and the $WCl_6$ gas is supplied from the gas supply hole 250a into the process chamber 201 and is exhausted from the exhaust pipe 231. At this time, the $WCl_6$ gas is supplied to the wafer 200. At this time, the valve 243d is opened at the same time, and inert gas such as $N_2$ gas is made to flow to the gas supply pipe 232d. The flow rate of the $N_2$ gas is adjusted by the MFC 241d, and the $N_2$ gas is supplied into the process chamber 201 together with the $WCl_6$ gas and is exhausted from the exhaust pipe 231.

At this time, in order to prevent the intrusion of the $WCl_6$ gas into the nozzle 249b, the valve 243e is opened and the $N_2$ gas is made to flow to the gas supply pipe 232e. The $N_2$ gas is supplied into the process chamber 201 through the gas supply pipe 232b and the nozzle 249b and is exhausted from the exhaust pipe 231.

At this time, the APC valve 244 is appropriately adjusted such that the pressure inside the process chamber 201 is set to a pressure of a range of, for example, 1 to 5000 Pa, preferably 10 to 1000 Pa, and more preferably 50 to 500 Pa. The supply flow rate of the $WCl_6$ gas controlled by the MFC 241a is set to a flow rate of a range of, for example, 1 to 2000 sccm. The supply flow rates of the $N_2$ gas controlled by the MFCs 241d and 241e are set to a flow rate of a range of, for example, 100 to 10000 sccm, respectively. The time to supply the $WCl_6$ gas to the wafer 200, that is, the gas supply time (irradiation time), is set to a time of a range of, for example, 1 to 120 seconds, and preferably 1 to 60 seconds. At this time, the temperature of the heater 207 is set such that the temperature of the wafer 200 is set to a temperature of a range of, for example, 150 to 700° C., preferably 180 to 600° C., and more preferably 200 to 400° C.

When the temperature of the wafer 200 is less than 150° C., $WCl_6$ is not chemisorbed on the wafer 200, and a practical deposition rate cannot be obtained. This can be solved by increasing the temperature of the wafer 200 to 150° C. or more. By increasing the temperature of the wafer 200 to 180° C. or more, further 200° C. or more, $WCl_6$ can be sufficiently adsorbed on the wafer 200, and a more sufficient deposition rate can be obtained.

When the temperature of the wafer 200 exceeds 700° C., CVD reaction becomes strong (gas-phase reaction is dominant). Therefore, the film thickness uniformity is easily degraded and the control becomes difficult. By decreasing the temperature of the wafer 200 to 700° C. or less, the degradation of the film thickness uniformity can be suppressed and the control can be performed. In particular, by decreasing the temperature of the wafer 200 to 600° C. or less, further 400° C. or less, the surface reaction is dominant. Therefore, the film thickness uniformity can be easily secured and the control can be facilitated.

Therefore, it is preferable that the temperature of the wafer 200 is set to a temperature of a range of 150 to 700° C., preferably 180 to 600° C., and more preferably 200 to 400° C.

By supplying the $WCl_6$ to the wafer 200 under the above-described condition, a W-containing layer containing Cl is formed on a base film of the surface of the wafer 200 to a thickness of, for example, less than one atomic layer to several atomic layers. The W-containing layer containing Cl may be an adsorption layer of the $WCl_6$ gas, may be a W layer containing Cl, or may contain both of them.

The W layer containing Cl is a generic term including not only a Cl-containing continuous layer configured by W but also a discontinuous layer, or a W thin film containing Cl overlapped with them. The Cl-containing continuous layer configured by W may be a W thin film containing Cl. W constituting the W layer containing Cl includes a case where bonding with Cl is not completely cut, and a case where bonding with Cl is completely cut.

The adsorption layer of the $WCl_6$ gas includes not only a continuous adsorption layer of gas molecules of the $WCl_6$ gas but also a discontinuous adsorption layer. That is, the adsorption layer of the $WCl_6$ gas includes not only one molecular layer configured by $WCl_6$ molecules or an adsorption layer of a thickness of less than one molecular layer. The $WCl_6$ molecules constituting the adsorption layer of the $WCl_6$ gas include those in which W bonding with Cl is partially cut. That is, the adsorption layer of the $WCl_6$ gas may include a physical adsorption layer of the $WCl_6$ gas, may include a chemical adsorption layer of the $WCl_6$ gas, or may include both of them.

In this specification, the layer of the thickness of less than one atomic layer means an atomic layer that is discontinuously formed, and the layer of the thickness of one atomic layer means an atomic layer that is continuously formed. The layer of the thickness of less than one molecular layer means a molecular layer that is discontinuously formed, and the layer of the thickness of one molecular layer means a molecular layer that is continuously formed.

Under a condition that the $WCl_6$ is self-decomposed (thermally decomposed), that is, a condition that a thermal decomposition reaction of the $WCl_6$ gas occurs, W is deposited on the wafer 200 to form a W layer containing Cl. Under a condition that the $WCl_6$ is not self-decomposed (thermally decomposed), that is, a condition that a thermal decomposition reaction of the $WCl_6$ gas does not occur, the $WCl_6$ gas is adsorbed on the wafer 200 to form an adsorption layer of the $WCl_6$ gas. As compared with the formation of the adsorption layer of the $WCl_6$ gas on the wafer 200, the formation of the W layer containing Cl is preferable because the deposition rate can be increased.

When the thickness of the W-containing layer containing Cl, which is formed on the wafer 200, exceeds several atomic layers, the reforming effect in step 2a to be described below does not reach the whole W-containing layer containing Cl. Also, a minimum value of the thickness of the W-containing layer containing Cl, which can be formed on the wafer 200, is less than one atomic layer. Therefore, it is preferable that the thickness of the W-containing layer containing Cl is set to less than one atomic layer to several atomic layers. Also, when the thickness of the W-containing layer containing Cl is set to one atomic layer or less, that is, one atomic layer or less than one atomic layer, the effect of the reforming reaction in step 2a to be described below can be relatively increased, and the time necessary for the reforming reaction in step 2a can be reduced. The time necessary for forming the W-containing layer containing Cl in step 1a can be reduced. As a result, the processing time per 1 cycle can be reduced and the total processing time can be reduced. That is, the deposition rate can be increased. Also, when the thickness of the W-containing layer containing Cl is set to one atomic layer or less, the controllability of the film thickness uniformity can be increased.

(Removal of Residual Gas)

After the W-containing layer containing Cl is formed, the valve 243a is closed to stop the supplying of the $WCl_6$ gas. At this time, the APC valve 244 is maintained in the opened state, and the inside of the process chamber 201 is vacuum-exhausted by the vacuum pump 246. The unreacted $WCl_6$ gas remaining in the process chamber 201 or the $WCl_6$ gas after contributing to the formation of the W-containing layer containing Cl is removed from the process chamber 201. At this time, the valves 243d and 243e are maintained in the opened state, and the supplying of the $N_2$ gas into the process chamber 201 as the inert gas is maintained. The $N_2$ gas acts as purge gas. This can increase the effect that the unreacted $WCl_6$ gas remaining in the process chamber 201 or the $WCl_6$ gas after contributing to the formation of the W-containing layer containing Cl is removed from the process chamber 201.

At this time, the gas remaining in the process chamber 201 may not be completely removed, and the inside of the process chamber 201 may not be completely purged. When the amount of the gas remaining in the process chamber 201 is small, an adverse effect does not occur in step 2a that is performed after that. At this time, the flow rate of the $N_2$ gas to be supplied into the process chamber 201 also need not be large. For example, by supplying substantially the same amount as the volume of the reaction tube 203 (process chamber 201), the purge can be performed to the extent that an adverse effect does not occur in step 2a. Since the inside of the process chamber 201 is not completely purged, the purge time can be reduced and the throughput can be improved. Also, it is possible to minimize the consumption of the $N_2$ gas.

In addition to the $WCl_6$ gas, inorganic chlorotungsten-based gas, such as dichlorotungsten ($WCl_2$) gas, oxytetrachlorotungsten ($WOCl_5$) gas, or azidepentachlorotungsten ($Cl_5N_3W$) gas, may also be used as the first precursor gas.

In addition to the $N_2$ gas, rare gas, such as Ar gas, He gas, Ne gas, or Xe gas, may also be used as the inert gas.

(Step 2a)
(Supplying of $B_2H_6$ Gas)

After step 1a is completed and thus the residual gas is removed from the process chamber 201, the valve 243b is opened and $B_2H_6$ gas is made to flow to the gas supply pipe 232b. The flow rate of the $B_2H_6$ gas is adjusted by the MFC 241b, and the $B_2H_6$ gas is supplied from the gas supply hole 250b into the process chamber 201 and is exhausted from the exhaust pipe 231. At this time, the $B_2H_6$ gas activated by heat is supplied to the wafer 200. At this time, the valve 243e is opened at the same time, and $N_2$ gas as inert gas is made to flow to the gas supply pipe 232e. The flow rate of the $N_2$ gas is adjusted by the MFC 241e, and the $N_2$ gas is supplied into the process chamber 201 together with the $B_2H_6$ gas and is exhausted from the exhaust pipe 231.

At this time, in order to prevent the intrusion of the $B_2H_6$ gas into the nozzle 249a, the valve 243d is opened and the $N_2$ gas is made to flow to the gas supply pipe 232d. The $N_2$ gas is supplied into the process chamber 201 through the gas supply pipe 232a and the nozzle 249a and is exhausted from the exhaust pipe 231.

At this time, the APC valve 244 is appropriately adjusted such that the pressure inside the process chamber 201 is in a pressure range of, for example, 1 to 5000 Pa, preferably 10 to 1000 Pa, and more preferably 50 to 500 Pa. By setting the pressure inside the process chamber 201 to such a pressure zone, the $B_2H_6$ gas can be thermally activated in non-plasma. By supplying the $B_2H_6$ gas that is activated by heat, a soft reaction can be caused and the reforming to be described below can be softly performed. The supply flow rate of the $B_2H_6$ gas controlled by the MFC 241b is set to a flow rate of a range of, for example, 1 to 2000 sccm. The supply flow rates of the $N_2$ gas controlled by the MFCs 241d and 241e are set to a flow rate of a range of, for example, 100 to 10000 sccm, respectively. The time to supply the thermally activated $B_2H_6$ gas to the wafer 200, that is, the gas supply time (irradiation time), is set to a time of a range of, for example, 1 to 120 seconds, and preferably 1 to 60 seconds. At this time, similar to step 1a, the temperature of the heater 207 is set such that the temperature of the wafer 200 is set to a temperature of a range of, for example, 150 to 700° C., preferably 180 to 600° C., and more preferably 200 to 400° C.

By supplying the $B_2H_6$ gas to the wafer 200 under the above-described condition, the W-containing layer containing Cl, which is formed on the base film of the wafer 200 in step 1a, reacts with the $B_2H_6$ gas. That is, Cl (chloro group) being the halogen element (halogen group) included in the W-containing layer containing Cl can react with the $B_2H_6$ gas. In this way, Cl of the W-containing layer containing Cl, which reacts with $B_2H_6$, can be separated (extracted) from the W-containing layer containing Cl. Due to this reaction, Cl is desorbed from the W-containing layer containing Cl, and the W-containing layer containing Cl is changed (reformed) to a first layer containing W (first W layer). The first W layer is a layer essentially consisting of W of the thickness of less than one atomic layer to several atomic layers, that is, a layer containing W as a main component.

When the first W layer is formed, Cl included in the W-containing layer containing Cl and the $B_2H_6$ gas constitutes a gaseous material containing at least one selected from the group consisting of Cl, B, and H in the process of the reforming reaction of the W-containing layer containing Cl by the $B_2H_6$ gas, and is exhausted from the process chamber 201 through the exhaust pipe 231. That is, impurities such as Cl of the W-containing layer containing Cl are extracted or desorbed from the W-containing layer containing Cl and are separated from the W-containing layer containing Cl. In this way, the first W layer is a layer that has less impurities such as Cl, as compared with the W-containing layer containing Cl.

(Removal of Residual Gas)

After the first W layer is formed, the valve 243b is closed to stop the supplying of the $B_2H_6$ gas. At this time, the APC valve 244 is maintained in the opened state, and the inside of the process chamber 201 is vacuum-exhausted by the vacuum pump 246. The unreacted $B_2H_6$ gas remaining in the process chamber 201, the $B_2H_6$ gas after contributing to the formation of the first W layer, or the reaction by-product is removed from the process chamber 201. At this time, the valves 243d and 243e are maintained in the opened state, and the supplying of the $N_2$ gas into the process chamber 201 as the inert gas is maintained. The $N_2$ gas acts as purge gas. This can increase the effect that the unreacted $B_2H_6$ gas remaining in the process chamber 201, the $B_2H_6$ gas after contributing to the formation of the first W layer, or the reaction by-product is removed from the process chamber 201.

At this time, the gas remaining in the process chamber 201 may not be completely removed, and the inside of the process chamber 201 may not be completely purged. When the amount of the gas remaining in the process chamber 201 is small, an adverse effect does not occur in step 1a that is performed after that. At this time, the flow rate of the $N_2$ gas to be supplied into the process chamber 201 also need not be large. For example, by supplying substantially the same amount as the volume of the reaction tube 203 (process chamber 201), the purge can be performed to the extent that an adverse effect does not occur in step 1a. Since the inside of the process chamber 201 is not completely purged, the purge time can be reduced and the throughput can be improved. Also, it is possible to minimize the consumption of the $N_2$ gas.

In addition to the $B_2H_6$ gas, inorganic borane-based gas, such as triborane ($B_3H_8$, abbreviated to TB) gas or monoborane ($BH_3$, abbreviated to MB), inorganic silane-based gas, such as trisilane ($Si_3H_8$, abbreviated to TS) gas, disilane ($Si_2H_6$, abbreviated to DS), or monosilane ($SiH_4$, abbreviated to MS), hydrogen ($H_2$) gas, ammonia ($NH_3$) gas, hydrazine ($N_2H_4$) gas, or diazene ($N_2H_2$) gas can be used as the first reactant gas. That is, C-free hydrogen-containing gas, that is, inorganic hydrogen-containing gas, can be used as the first reactant gas.

In addition to the $N_2$ gas, rare gas, such as Ar gas, He gas, Ne gas, or Xe gas, may also be used as the inert gas.

(Perform Predetermined Number of Times)

Steps 1a and 2a described above are set as 1 cycle. By performing the cycle once or more (predetermined number of times), that is, by alternately performing steps 1a and 2a once or more (predetermined number of times), a film essentially consisting of W to a predetermined thickness can be formed on the base film of the surface of the wafer 200 as the first W film. That is, a W film being a film containing W as a main component can be formed.

When the thickness of the first W film is less than one atomic layer, that is, when the first W film is discontinuous, a second precursor gas ($WF_6$ gas) may be directly supplied to the base film of the surface of the wafer 200 in a second W film forming process to be described below. That is, the $WF_6$ gas may directly contact the base film of the surface of the wafer 200. Also, in the second W film forming process or heat treatment to be described below, an F diffusion barrier effect by the first W film may be degraded. As a result, the base film of the surface of the wafer 200 may be etched by F, and F may be diffused into the base film of the surface of the wafer 200. When the thickness of the first W film is one atomic layer or more, preferably 1 nm or more, and more preferably 5 nm or more, the $WF_6$ gas is not directly supplied to the base film of the surface of the wafer 200. Also, the F diffusion barrier effect by the first W film can be increased. As a result, it is possible to suppress the influence of F to the base film of the surface of the wafer 200.

Also, when the thickness of the first W film exceeds 15 nm, a total deposition time of a W film obtained by the first W film and the second W film being laminated is increased. Therefore, the productivity of the deposition process may be degraded. When the reactivity of the $WCl_6$ gas is lower than the reactivity of the $WF_6$ gas and the film is formed under the same condition, the deposition rate in the case of using the $WF_6$ gas is lower than the deposition rate in the case of using the $WCl_6$ gas. Therefore, as in the case where the thickness of the first W film exceeds 15 nm, when the deposition time in the case of using the $WCl_6$ gas is too long, the total deposition time will be affected. Also, when the thickness of the first W film exceeds 15 nm, the amount of use of the relatively expensive $WCl_6$ gas is increased and the cost of the deposition process is increased. When the thickness of the first W film is 15 nm or less, preferably 10 nm or less, the total deposition time of the W film can be reduced and the productivity of the deposition process can be improved. Also, the amount of use of the $WCl_6$ gas can be appropriately controlled and the cost of the deposition process can be reduced.

Therefore, it is preferable that the thickness of the first W film is one atomic layer or more, preferably 1 nm or more and 15 nm or less, and more preferably 5 nm or more and 10 nm or less.

It is preferable that the above-described cycle is repeated twice or more. That is, it is preferable that the thickness of the first W layer to be formed per 1 cycle is made to be smaller than a desired thickness and the above-described cycle is repeated twice or more until the desired thickness is obtained.

In a case where the cycle is performed twice or more, in each step subsequent to at least the second cycle, the description "a predetermined gas is supplied to the wafer 200" means that "a predetermined gas is supplied to the layer formed on the wafer 200, that is, the outermost surface of the wafer 200 as the laminate", and the description "predetermined layer is formed on the wafer 200" means that "a predetermined layer is formed on the layer formed on the wafer 200, that is, the outermost layer of the wafer 200 as the laminate". This point is the same as described above. This point is also the same as a second W film forming process and another embodiment to be described below.

(Second W Film Forming Process)

After that, the following two steps, that is, steps 1b and 2b, are sequentially performed.

(Step 1b)

(Supplying of $WF_6$ Gas)

The valve 243c is opened and $WF_6$ gas is supplied to the gas supply pipe 232c. The flow rate of the $WF_6$ gas is adjusted by the MFC 241c, and the $WF_6$ gas is supplied from the gas supply hole 250a into the process chamber 201 through the gas supply pipe 232a and is exhausted from the exhaust pipe 231. At this time, the $WF_6$ gas is supplied to the wafer 200. At this time, the valve 243d is opened at the same time, and inert gas such as $N_2$ gas is made to flow to the gas supply pipe 232d. The flow rate of the $N_2$ gas is adjusted by the MFC 241d, and the $N_2$ gas is supplied into the process chamber 201 together with the $WF_6$ and is exhausted from the exhaust pipe 231.

At this time, in order to prevent the intrusion of the $WF_6$ gas into the nozzle 249b, the valve 243e is opened and the $N_2$ gas is made to flow to the gas supply pipe 232e. The $N_2$ gas is supplied into the process chamber 201 through the gas supply pipe 232b and the nozzle 249b and is exhausted from the exhaust pipe 231.

At this time, the APC valve 244 is appropriately adjusted such that the pressure inside the process chamber 201 is in a pressure range of, for example, 1 to 5000 Pa, preferably 10 to 1000 Pa, and more preferably 50 to 500 Pa. The supply flow rate of the $WF_6$ gas controlled by the MFC 241c is set to a flow rate of a range of, for example, 1 to 2000 sccm. The supply flow rates of the $N_2$ gas controlled by the MFCs 241d and 241e are set to a flow rate of a range of, for example, 100 to 10000 sccm, respectively. The time to supply the $WF_6$ gas to the wafer 200, that is, the gas supply time (irradiation time), is set to a time of a range of, for example, 1 to 120 seconds, and preferably 1 to 60 seconds. At this time, the temperature of the heater 207 is set to the same temperature as in the first W film forming process, that is, set such that the temperature of the wafer 200 is set to a temperature of a range of, for example, 150 to 700° C., preferably 180 to 600° C., and more preferably 200 to 400° C.

When the temperature of the wafer 200 is less than 150° C., $WF_6$ is not chemisorbed on the wafer 200, and a practical deposition rate cannot be obtained. This can be solved by increasing the temperature of the wafer 200 to 150° C. or more. By increasing the temperature of the wafer 200 to 180° C. or more, further 200° C. or more, $WF_6$ can be sufficiently adsorbed on the wafer 200, and a more sufficient deposition rate can be obtained.

When the temperature of the wafer 200 exceeds 700° C., a CVD reaction becomes strong (gas-phase reaction is dominant). Therefore, the film thickness uniformity is easily degraded and the control becomes difficult. By decreasing the temperature of the wafer 200 to 700° C. or less, the degradation of the film thickness uniformity can be suppressed and the control can be performed. In particular, by decreasing the temperature of the wafer 200 to 600° C. or less, further 400° C. or less, the surface reaction is dominant. Therefore, the film thickness uniformity can be easily secured and the control can be facilitated.

Therefore, it is preferable that the temperature of the wafer 200 is set to a temperature of a range of 150 to 700° C., preferably 180 to 600° C., and more preferably 200 to 400° C.

By supplying the $WF_6$ to the wafer 200 under the above-described condition, a W-containing layer containing F is formed on the first W film to a thickness of, for example, less than one atomic layer to several atomic layers. The W-containing layer containing F may be an adsorption layer of the $WF_6$ gas, may be a W layer containing F, or may contain both of them.

The W layer containing F is a generic term including not only an F-containing continuous layer configured by W but also a discontinuous layer, or a W thin film containing F overlapped with them. The F-containing continuous layer configured by W may be a W thin film containing F. W constituting the W layer containing F includes a case where bonding with F is not completely cut, and a case where bonding with F is completely cut.

The adsorption layer of the $WF_6$ gas includes not only a continuous adsorption layer of gas molecules of the $WF_6$ gas but also a discontinuous adsorption layer. That is, the adsorption layer of the $WF_6$ gas includes not only one molecular layer configured by $WF_6$ molecules or an adsorption layer of a thickness of less than one molecular layer. The $WF_6$ molecules constituting the adsorption layer of the $WF_6$ gas include those in which W bonding with F is partially cut. That is, the adsorption layer of the $WF_6$ gas may include a physical adsorption layer of the $WF_6$ gas, may include a chemical adsorption layer of the $WF_6$ gas, or may include both of them.

Under a condition that the $WF_6$ is self-decomposed (thermally decomposed), that is, a condition that a thermal decomposition reaction of the $WF_6$ gas occurs, W is deposited on the first W film to form a W layer containing F. Under a condition that the $WF_6$ is not self-decomposed (thermally decomposed), that is, a condition that a thermal decomposition reaction of the $WF_6$ gas does not occur, the $WF_6$ gas is adsorbed on the first W film to form an adsorption layer of the $WF_6$ gas. As compared with the formation of the adsorption of the $WF_6$ gas on the first W film, the formation of the W layer containing F is preferable because the deposition rate can be increased.

When the thickness of the W-containing layer containing F, which is formed on the first W film, exceeds several atomic layers, the reforming effect in step 2b to be described below does not reach the whole W-containing layer containing F. Also, a minimum value of the thickness of the W-containing layer containing F, which can be formed on the first W film, is less than one atomic layer. Therefore, it is preferable that the thickness of the W-containing layer containing F is set to less than one atomic layer to several atomic layers. Also, when the thickness of the W-containing layer containing F is set to one atomic layer or less, that is, one atomic layer or less than one atomic layer, the effect of the reforming reaction in step 2b to be described below can be relatively increased, and the time necessary for the modifying reaction in step 2b can be reduced. The time necessary for forming the W-containing layer containing F in step 1b can be reduced. As a result, the processing time per 1 cycle can be reduced and the total processing time can be reduced. That is, the deposition rate can be increased. Also, when the thickness of the W-containing layer containing F is set to one atomic layer or less, the controllability of the film thickness uniformity can be increased.

(Removal of Residual Gas)

After the W-containing layer containing F is formed, the valve 243c is closed to stop the supplying of the $WF_6$ gas. At this time, the APC valve 244 is maintained in the opened state, and the inside of the process chamber 201 is vacuum-exhausted by the vacuum pump 246. The unreacted $WF_6$ gas remaining in the process chamber 201 or the $WF_6$ gas after contributing to the formation of the W-containing layer containing F is removed from the process chamber 201. At this time, the valves 243d and 243e are maintained in the opened state, and the supplying of the $N_2$ gas into the process chamber 201 as the inert gas is maintained. The $N_2$ gas acts as purge gas. This can increase the effect that the unreacted $WF_6$ gas remaining in the process chamber 201 or the $WF_6$ gas after contributing to the formation of the W-containing layer containing F is removed from the process chamber 201.

At this time, the gas remaining in the process chamber 201 may not be completely removed, and the inside of the process chamber 201 may not be completely purged. When the amount of the gas remaining in the process chamber 201 is small, an adverse effect does not occur in step 2b that is performed after that. At this time, the flow rate of the $N_2$ gas to be supplied into the process chamber 201 also need not be large flow rate. For example, by supplying substantially the same amount as the volume of the reaction tube 203 (process chamber 201), the purge can be performed to the extent that an adverse effect does not occur in step 2b. Since the inside of the process chamber 201 is not completely purged, the purge time can be reduced and the throughput can be improved. Also, it is possible to minimize the consumption of the $N_2$ gas.

In addition to the $WF_6$ gas, other inorganic fluorotungsten-based gas may be used as the second precursor gas.

In addition to the $N_2$ gas, rare gas, such as Ar gas, He gas, Ne gas, or Xe gas, may also be used as the inert gas.

(Step 2b)

(Supplying of $B_2H_6$ Gas)

After step 1b is completed and thus the residual gas is removed from the process chamber 201, step 2b is performed to supply $B_2H_6$ gas to the wafer 200 as a second reactant gas. Step 2b is performed in the same manner as step 2a described above.

By supplying the $B_2H_6$ gas to the wafer 200 in the same sequence as step 2a under the same condition as step 2a, the W-containing layer containing F, which is formed on the first W film in step 1b, reacts with the $B_2H_6$ gas. That is, F (fluoro group) being the halogen element (halogen group) included in the W-containing layer containing F can react with the $B_2H_6$ gas. In this way, F of the W-containing layer containing F, which reacts with $B_2H_6$, can be separated (extracted) from the W-containing layer containing F. Due to this reaction, F is desorbed from the W-containing layer containing F, and the W-containing layer containing F is changed (reformed) to a second layer containing W (second W layer). The second W layer is a layer essentially consisting of W of the thickness of less than one atomic layer to several atomic layers, that is, a layer containing W as a main component.

When the second W layer is formed, F included in the W-containing layer containing F and the $B_2H_6$ gas constitutes a gaseous material containing at least one selected from the group consisting of F, B, and H in the process of the reforming reaction of the W-containing layer containing F by the $B_2H_6$ gas, and is exhausted from the process chamber 201 through the exhaust pipe 231. That is, impurities such as F of the W-containing layer containing F are extracted or desorbed from the W-containing layer containing F and is separated from the W-containing layer containing F. In this way, the second W layer is a layer that has less impurities such as F, as compared with the W-containing layer containing F.

(Removal of Residual Gas)

After the second W film is formed, the unreacted $B_2H_6$ gas remaining in the process chamber 201, the $B_2H_6$ gas after contributing to the reaction, or the reaction by-product is removed from the process chamber 201 by the same sequence and condition as step 2a described above. At this time, the gas remaining in the process chamber 201 may not be completely removed, and the inside of the process chamber 201 may not be completely purged. This point is the same as step 2a described above.

That is, the same gas as the first reactant gas, that is, inorganic hydrogen-containing gas, can be used as the second reactant gas. Also, the same gas or different gases may be used as the first reactant gas and the second reactant gas.

In addition to the $N_2$ gas, rare gas, such as Ar gas, He gas, Ne gas, or Xe gas, may also be used as the inert gas.

(Perform Predetermined Number of Times)

Steps 1b and 2b described above are set as 1 cycle. By performing the cycle once or more (predetermined number of times), that is, by alternately performing steps 1b and 2b once or more (predetermined number of times), a film essentially consisting of W to a predetermined thickness can be formed on the first W film as the second W film. That is, a W film being a film containing W as a main component can be formed. That is, as the W-containing film, a W film obtained by the first W film and the second W film being laminated in this order can be formed on the base film of the surface of the wafer 200 to a predetermined thickness. The film obtained by the first W film and the second W film being laminated is also a film essentially consisting of W, that is, a film containing W as a main component. It is preferable that the above-described cycle is repeated twice or more. That is, it is preferable that the thickness of the second W layer to be formed per 1 cycle is made to be smaller than a desired thickness and the above-described cycle is repeated twice or more until the desired thickness is obtained.

(Heat Treatment)

Subsequently, heat treatment is performed on the W film formed on the base film of the surface of the wafer 200. Herein, the energization state of the heater 207 is adjusted such that the temperature of the wafer 200 becomes 600° C. or more, for example, 800 to 850° C., and heat treatment (annealing process) is performed on the W film. The annealing process is performed, for example, under inert gas atmosphere such as $N_2$ gas. The processing time of the annealing process is a predetermined time in a range of, for example, 1 to 120 seconds. By performing the annealing process, the crystal state of the W film formed on the base film of the surface of the wafer 200 can be set to a desired crystal state and the crystal state can be stabilized. Also, impurities remaining in the W film can be desorbed. That is, the W film can be reformed by the annealing process. Also, the W film can be densified by the annealing process.

In the present embodiment, the example in which the W film forming process (the first W film forming process and the second W film forming process) and the heat treatment are performed in the same process chamber 201 (in-situ) has been described, but the W film forming process and the heat treatment can be performed in different process chambers (ex-situ). When the two processes are performed in-situ, the wafer 200 is not exposed to the atmosphere during the processes, and the wafer 200 can be consistently processed in a state of being in vacuum, and a stable film-forming process can be performed. When the two processes are performed ex-situ, the temperatures inside the process chambers can be preset to processing temperatures of the respective processes or temperatures close thereto. Therefore, the temperature adjustment time can be reduced and the production efficiency can be increased.

(Purge and Returning to Atmospheric Pressure)

When the annealing process on the wafer 200 is completed, the valves 243d and 243e are opened and $N_2$ gas as inert gas is supplied from the gas supply pipes 232d and 232e and are exhausted from the exhaust pipe 231. The $N_2$ gas acts as purge gas. The inside of the process chamber 201 is purged by the inert gas, so that the reaction by-product and the gas remaining in the process chamber 201 are removed from the process chamber 201 (purged). After that, the atmosphere inside the process chamber 201 is replaced with the inert gas (inert gas replacement) and the pressure inside the process chamber 201 is returned to the atmospheric pressure (returning to the atmospheric pressure).

(Boat Unloading and Wafer Discharging)

After that, the seal cap 219 is moved downward by the boat elevator 115. The lower end of the reaction tube 203 is opened and the boat is unloaded from the lower end of the reaction tube 203 to the outside of the reaction tube 203 in a state in which the processed wafer 200 is supported to the boat 217 (boat unloading). After that, the processed wafer 200 is discharged from the boat 217 (wafer discharging).

(3) Effects of Present Embodiment

According to the present embodiment, one or more effects described below are exhibited.

(a) According to the present embodiment, the first W film is formed on the base film of the surface of the wafer 200 by performing the cycle a predetermined number of times, the cycle including the process of supplying the F-free first precursor gas ($WCl_6$ gas) to the wafer 200 and the process of supplying the first reactant gas ($B_2H_6$ gas) having reducibility to the wafer 200. That is, the first W film is formed without supplying the F-containing gas to the wafer 200. Therefore, it is possible to prevent F from being supplied to the base film of the surface of the wafer 200, and it is possible to prevent the base film of the surface of the wafer 200 from being etched by F.

Also, according to the present embodiment, after the first W film is formed on the base film of the surface of the wafer 200, the second W film is formed on the first W film by performing the cycle a predetermined number of times, the cycle including the process of supplying the second precursor gas ($WF_6$ gas) containing F to the wafer 200 and the process of supplying the second reactant gas ($B_2H_6$ gas) having reducibility to the wafer 200. Also, the thickness of the first W film is set to one atomic layer or more, preferably 1 nm or more, and more preferably 5 nm or more. That is, when the second W film forming process is performed, the base film of the surface of the wafer 200 is not exposed and is covered by the first W film being the continuous film. Therefore, in the second W film forming process, it is possible to prevent the $WF_6$ gas from being directly supplied to the base film of the surface of the wafer 200, and it is possible to prevent the base film of the surface of the wafer 200 from being etched by the $WF_6$ gas, that is, F contained in the $WF_6$ gas.

In this way, according to the present embodiment, when the W film is formed on the wafer 200 by using the F-containing precursor gas, it is possible to prevent the base of the film formation, that is, the base film of the surface of the wafer 200 from being etched. Therefore, it is possible to prevent the formed W film from being peeled off from the base of the film formation. Also, the in-plane film thickness uniformity of the W film can be improved and the flatness of the W film can also be improved. This effect is useful especially when the Si-containing film, which is easily etched by F, is deposited as the base of the film formation.

(b) In the second W film forming process, the first W film according to the present embodiment functions to prevent F contained in the second precursor gas ($WF_6$ gas) from being diffused (moved) into the base film of the surface of the wafer 200. Also, even in the process of performing the heat treatment on the W film formed on the base film of the surface of the wafer 200, the first W film functions to prevent F contained in the second W film from being diffused (moved) into the base film of the surface of the wafer 200. That is, the first W film functions as the F diffusion barrier film in the second W film forming process and the heat treatment.

Therefore, according to the present embodiment, when the W film is formed on the wafer 200 by using the F-containing precursor gas, it is possible to prevent F from being diffused into the base film of the surface of the wafer 200 that is the base of the film formation. Therefore, the influence of F to the base of the film formation can be reduced. For example, when the W film is formed by using an insulation film (metal insulation film) such as an AlO film or a HfO film as the base of the film formation, it is possible to prevent F from being diffused into the insulation film and it is possible to prevent the insulation property of the insulation film from being degraded.

(c) According to the present embodiment, the first W film is formed by an alternate supply method of alternately supplying the first precursor gas ($WCl_6$ gas) and the first reactant gas ($B_2H_6$ gas) to the wafer 200. By using the alternate supply method, the F diffusion barrier effect by the first W film can be further improved as compared with the case of using a simultaneous supply method of simultaneously supplying the $WCl_6$ gas and the $B_2H_6$ gas to the wafer 200. As a result, in the second W film forming process and the heat treatment, the diffusion of F into the base film of the surface of the wafer 200 can be prevented more reliably.

(d) According to the present embodiment, inorganic gas, that is, C-free gas is used as the first precursor gas. Therefore, it is possible to prevent impurities such as C from being mixed to the first W film, and the impurity concentration of the W film is reduced, thereby preventing the degradation in the conductivity of the W film.

The first precursor gas may be not only C-free but also O-free. That is, it is preferable that the first precursor gas is C- and O-free gas. By using such gas, it is possible to prevent impurities such as C and O from being mixed to the first W film, and the impurity concentration of the W film can be further reduced, thereby further preventing the degradation in the conductivity of the W film. Also, by using the O-free gas, the oxidation of the first W film and the base film of the surface of the wafer 200 can be prevented. The $WCl_6$ gas used as the first precursor gas in the present embodiment may be not only C-free but also O-free.

Also, it is preferable that the first precursor gas is C-free, N-free, H-free, and O-free. That is, it is preferable that the first precursor gas is C-, N-, H-, and O-free gas. By using such gas, it is possible to prevent impurities such as C, N, H and O from being mixed to the first W film, and the impurity concentration of the W film can be further reduced, thereby further preventing the degradation in the conductivity of the W film. Also, by using the N-free gas, the nitridation of the first W film and the base film of the surface of the wafer 200 can be prevented. Also, by using the O-free gas, the oxidation of the first W film and the base film of the surface of the wafer 200 can be prevented. The $WCl_6$ gas used as the first precursor gas in the present embodiment may be C-free, N-free, H-free, H-free, and O-free.

(e) According to the present embodiment, by performing the reaction between the W-containing layer containing Cl and the $B_2H_6$ gas in step 2a, it is possible to extract or desorb impurities such as Cl from the W-containing layer containing Cl. Therefore, it is possible to reduce the impurity concentration of the first W layer, that is, the first W film. Also, by performing the reaction between the W-containing layer containing F and the $B_2H_6$ gas in step 2b, it is possible to extract or desorb impurities such as F from the W-containing layer containing F. Therefore, it is possible to reduce the impurity concentration of the second W layer, that is, the second W film. As a result, the impurity concentration of the W film is reduced, thereby preventing the degradation in the conductivity of the W film.

(f) According to the present embodiment, C-free hydrogen-containing gas, that is, inorganic hydrogen-containing gas, is used as the first reactant gas and the second reactant gas, respectively. Therefore, it is possible to prevent impurities such as C from being mixed to the first W film and the second W film, and the impurity concentration of the W film is reduced, thereby preventing the degradation in the conductivity of the W film.

(g) According to the present embodiment, the first W film forming process and the second W film forming process are performed in the same process chamber 201 in a state in which the temperature of the wafer 200 is set to the same temperature. That is, according to the present embodiment, it is unnecessary to provide the temperature adjustment time (waiting time) between the first W film forming process and the second W film process. Therefore, the total time necessary for the W film formation is reduced, thereby improving the total productivity of the substrate processing.

(h) According to the present embodiment, after the first W film is formed by using the $WCl_6$ gas and the $B_2H_6$ gas, the second W film is formed by using the $WF_6$ gas and the $B_2H_6$ gas. That is, the $WCl_6$ gas is used as the precursor gas in the initial stage of the deposition process, and after that, the precursor gas is switched to the $WF_6$ gas. Therefore, the total productivity of the W film can be improved. That is, the deposition rate of the W film in the case of using the $WF_6$ gas having relatively high reactivity is larger than the deposition rate of the W film in the case of using the $WCl_6$ gas having relatively mild reactivity. Therefore, according to the present embodiment, the productivity of the deposition process can be improved as compared with the case where only the $WCl_6$ gas is used as the precursor gas. Also, the $WCl_6$ gas is more expensive than the $WF_6$ gas. Therefore, in the present embodiment, the cost of the deposition can be reduced as compared with the case where the deposition is performed by using only the $WCl_6$ gas as the precursor gas.

Such effects are remarkably exhibited when the deposition time when forming the first W film is made shorter than the deposition time when forming the second W film. That is, such effects are more remarkably exhibited when the film thickness of the first W film is smaller (thinner) than the film thickness of the second W film. In this case, such effects are more remarkably exhibited when the thickness of the first W film is one atomic layer or more, preferably 1 nm or more and 15 nm or less, and more preferably 5 nm or more and 10 nm or less.

(i) According to the present embodiment, the first W film and the second W film are formed by the alternate supply method of alternately supplying the precursor gas and the reactant gas to the wafer 200. Therefore, the deposition processing of the first W film and the second W film can be appropriately performed under the condition that the surface reaction is dominant. As a result, the step coverage characteristic of the W film is improved and the controllability of the film thickness control of the W film can be increased.

Other Embodiments of Present Invention

So far, the embodiments of the present invention have been described. However, the present invention is not limited to the above-described embodiments, and various modifications can be made without departing from the scope of the present embodiments.

Modification 1

For example, in the above-described embodiment, the example in which the $B_2H_6$ gas, that is, gas containing no metal element (W) is used as the first reactant gas and the second reactant gas has been described. However, the present invention is not limited to the above example. For example, gas containing W and amino group, that is, amino tungsten-based gas, may be used as at least one selected from the group consisting of the first reactant gas and the second reactant gas. As the amino tungsten-based gas, for example, hexadimethyl amino tungsten ($W_2[N(CH_3)_2]_6$) gas may be used.

When the $W_2[N(CH_3)_2]_6$ gas is used as the first reactant gas, in step 2a, the $W_2[N(CH_3)_2]_6$ gas is supplied to the W-containing layer containing Cl, which is formed in step 1a. The $W_2[N(CH_3)_2]_6$ gas is supplied from the gas supply pipe 232b into the process chamber 201 through the MFC 241b, the valve 243b, and the nozzle 249b. The processing sequence and the processing condition at this time can be the same as the processing sequence and the processing condition in step 2a of the above-described embodiment. In this case, the amino tungsten-based gas supply system as the first reactant gas supply system is configured by the gas supply pipe 232b, the MFC 241b, and the valve 243b. The nozzle 249b may be included in the amino tungsten-based gas supply system.

By supplying the $W_2[N(CH_3)_2]_6$ gas to the wafer 200 under the above-described condition, the W-containing layer containing Cl, which is formed on the wafer 200 in step 1a, reacts with the $W_2[N(CH_3)_2]_6$ gas. That is, by supply the $W_2[N(CH_3)_2]_6$ gas to the wafer 200 heated to the above-described temperature, ligand containing the amino group is separated from W of the $W_2[N(CH_3)_2]_6$ gas. The separated ligand reacts with Cl of the W-containing layer containing Cl and Cl is extracted from the W-containing layer containing Cl. Furthermore, W having the dangling bond by separation of the ligand of the $W_2[N(CH_3)_2]_6$ gas is bonded with W having the dangling bond included in the W-containing layer from which Cl is extracted, or W having the dangling bond to form a W—W bonding. In this case, under the above-described condition, the ligand separated from W of the $W_2[N(CH_3)_2]_6$ gas inhibits the bonding with W of the W-containing layer containing Cl. Therefore, the W-containing layer containing Cl, which is formed on the wafer 200 in step 1a, contains W and is changed (reformed) to the first layer (first W layer) in which the content of impurities such as Cl, C, or N is extremely small. The first W layer is a layer essentially consisting of W elements of the thickness of less than one atomic layer to several atomic layers.

When the first W layer is formed, Cl included in the W-containing layer containing Cl before reforming reacts with the ligand containing the amino group included in the $W_2[N(CH_3)_2]_6$ gas in the process of the reforming reaction of the W-containing layer containing Cl by the $W_2[N(CH_3)_2]_6$ gas, and a gaseous reaction by-product such as the amino salt is formed and exhausted from the process chamber 201 through the exhaust pipe 231. Therefore, it is possible to reduce the amount of impurities such as Cl, C, or N contained in the W-containing layer containing Cl after reforming, that is, the first W film.

When the $W_2[N(CH_3)_2]_6$ gas is used as the second reactant gas, in step 2b, the $W_2[N(CH_3)_2]_6$ gas is supplied to the W-containing layer containing F, which is formed in step 1b. The $W_2[N(CH_3)_2]_6$ gas is supplied from the gas supply pipe 232b into the process chamber 201 through the MFC 241b, the valve 243b, and the nozzle 249b. The processing sequence and the processing condition at this time can be the same as the processing sequence and the processing condition in step 2b of the above-described embodiment. In this case, the amino tungsten-based gas supply system as the second reactant gas supply system is configured by the gas supply pipe 232b, the MFC 241b, and the valve 243b. The nozzle 249b may be included in the amino tungsten-based gas supply system.

By supplying the $W_2[N(CH_3)_2)]_6$ gas to the wafer 200 under the above-described condition, the W-containing layer containing F, which is formed on the first W film in step 1b, reacts with the $W_2[N(CH_3)_2)]_6$ gas. That is, by supply the $W_2[N(CH_3)_2)]_6$ gas to the wafer 200 heated to the above-described temperature, ligand containing the amino group is separated from W of the $W_2[N(CH_3)_2)]_6$ gas. The separated ligand reacts with F of the W-containing layer containing F and F is extracted from the W-containing layer containing F. Furthermore, W having the dangling bond by separation of the ligand of the $W_2[N(CH_3)_2)]_6$ gas is bonded with W having the dangling bond included in the W-containing layer from which F is extracted, or W having the dangling bond to form a W—W bonding. In this case, under the above-described condition, the ligand separated from W of the $W_2[N(CH_3)_2)]_6$ gas inhibits the bonding with W of the W-containing layer containing F. Therefore, the W-containing layer containing F, which is formed on the first W film in step 1b, contains W and is changed (reformed) to the second layer (second W layer) in which the content of impurities such as F, C, or N is extremely small. The second W layer is a layer essentially consisting of W of the thickness of less than two atomic layers to several atomic layers.

When the second W layer is formed, F included in the W-containing layer containing F before reforming reacts with the ligand containing the amino group included in the $W_2[N(CH_3)_2)]_6$ gas in the process of the reforming reaction of the W-containing layer containing F by the $W_2[N(CH_3)_2)]_6$ gas, and a gaseous reaction by-product such as the amino salt is formed and exhausted from the process chamber 201 through the exhaust pipe 231. Therefore, it is possible to reduce the amount of impurities such as F, C, or N contained in the W-containing layer containing F after reforming, that is, the second W film.

Figure 5B:
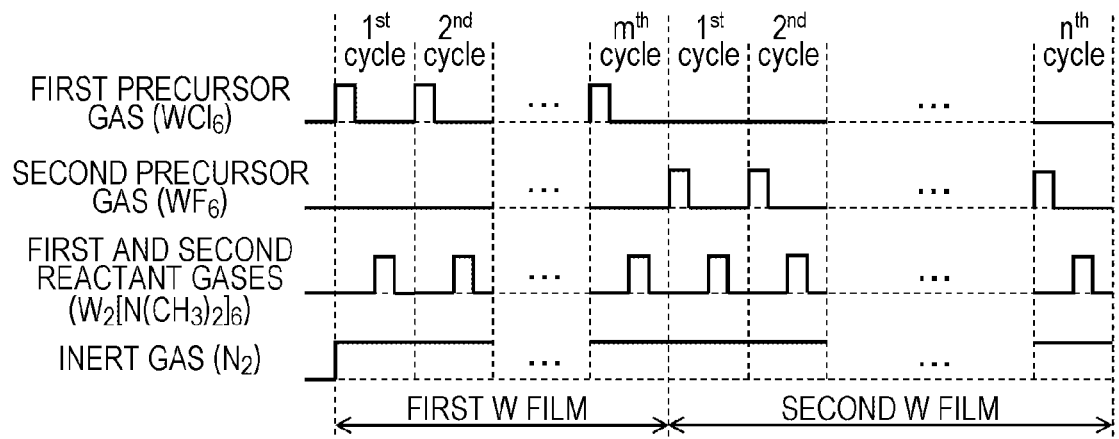
FIG. 5B is a diagram illustrating a timing of gas supply in the film-forming sequence according to another embodiment of the present invention.

FIG. 5B illustrates the timing of the gas supply in the film-forming sequence using the $W_2[N(CH_3)_2)]_6$ gas as the first reactant gas and the second reactant gas. Even in this case, the same effect as the above-described embodiment is exhibited. Also, in the first W film forming process and the second W film forming process, the film formation is performed using two types of tungsten sources (double tungsten sources) during 1 cycle. The deposition rate of the first W film and the deposition rate of the second W film can be increased, and the productivity of the W film deposition process can be further improved. When considering the W film forming process as a whole, since three types of tungsten sources (triple tungsten sources) are used, this film-forming method can be referred to as triple tungsten source deposition or triple metal source deposition. In this regard, the film-forming method of the above-described embodiment can be referred to as double tungsten source deposition or double metal source deposition.

In addition to the $W_2[N(CH_3)_2)]_6$ gas, hexamethylethyl amino tungsten $(W_2[N(CH_3)(C_2H_3)_6)])$ gas, hexadiethyl amino ditungsten $(W_2[N(C_2H_3)_6]_6)$ gas, butyl imide bis-butylamino tungsten gas, or bicester Shari butyl imide bisdimethyl amide tungsten $((t-C_4H_9NH)_2W=(Nt-C_4H_9)_2)$ gas may be used as the amino tungsten-based gas.

Modification 2

Figure 6A:
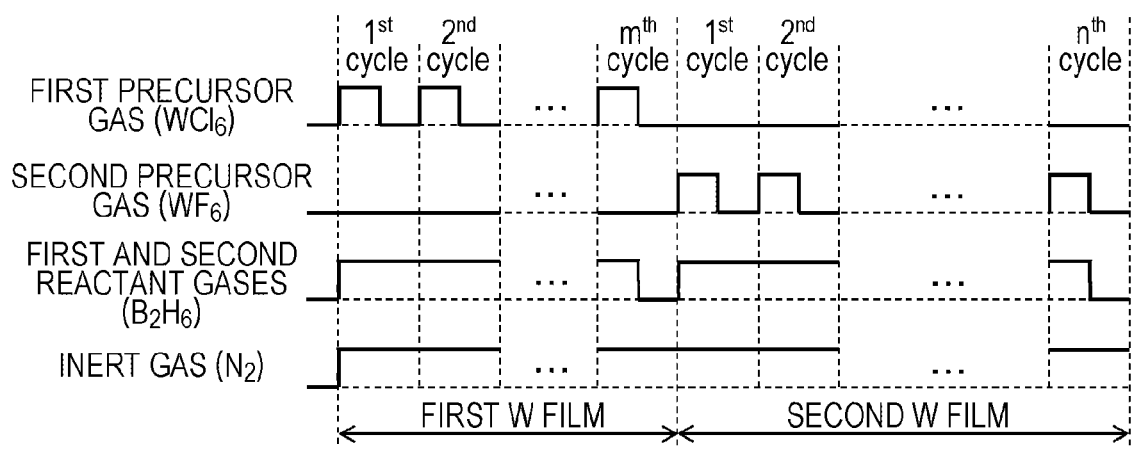
FIGS. 6A and 6B are diagrams illustrating film-forming flows of film-forming sequences according to another embodiment of the present invention, respectively.
Figure 6B:
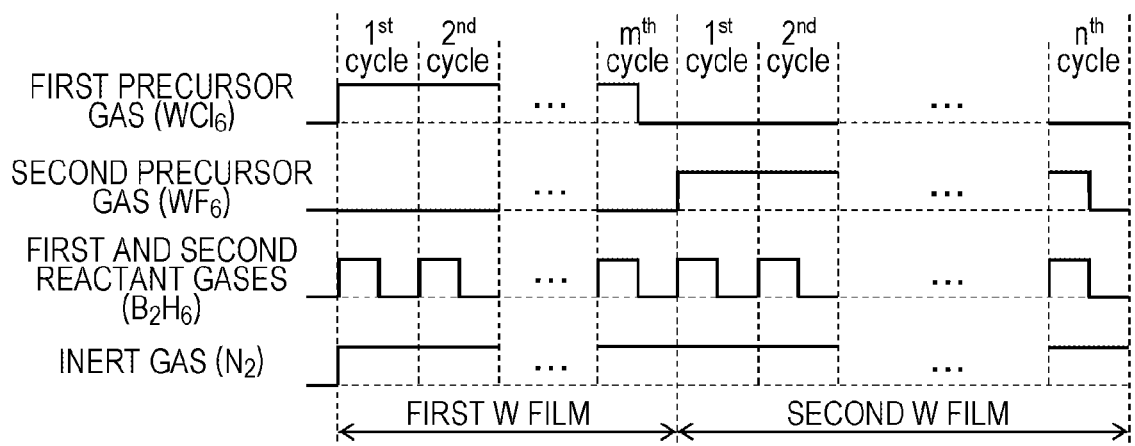
Figure 7A:
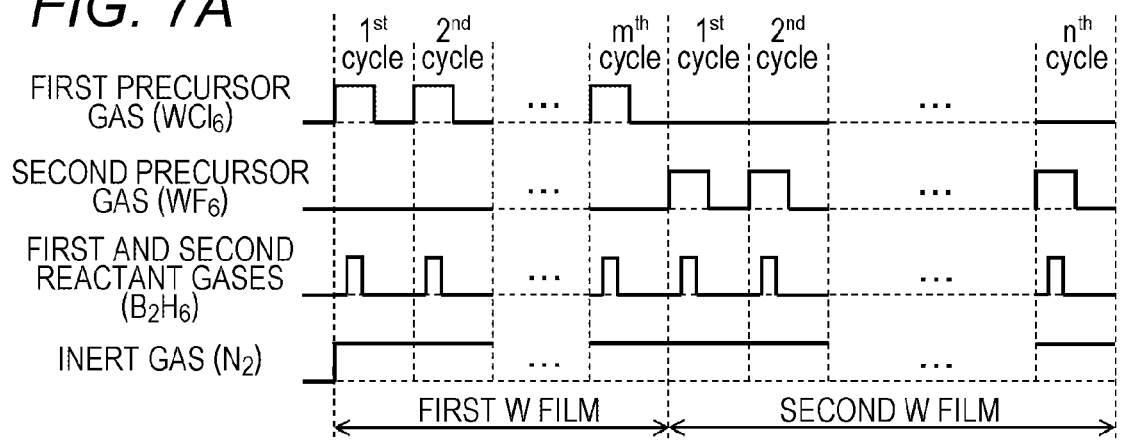
FIGS. 7A to 7C are diagrams illustrating film-forming flows of film-forming sequences according to another embodiment of the present invention, respectively.
Figure 7B:
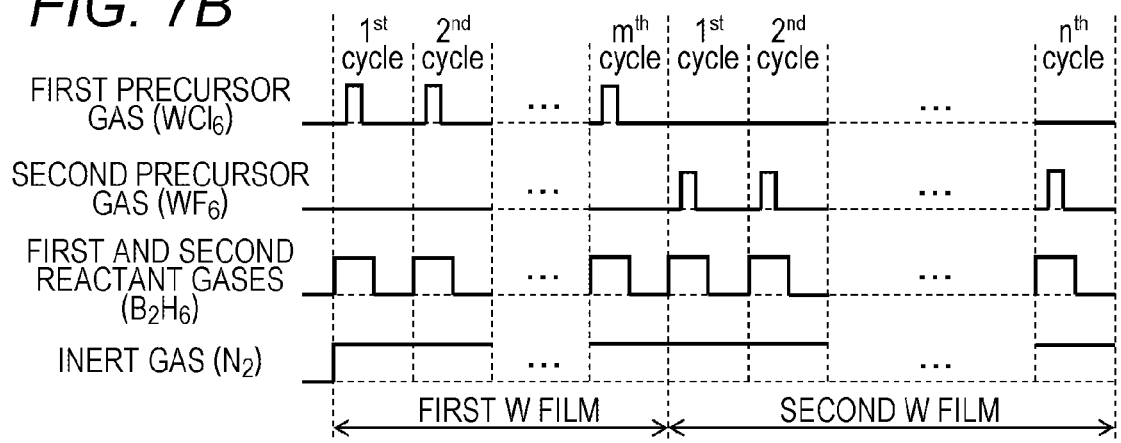
Figure 7C:
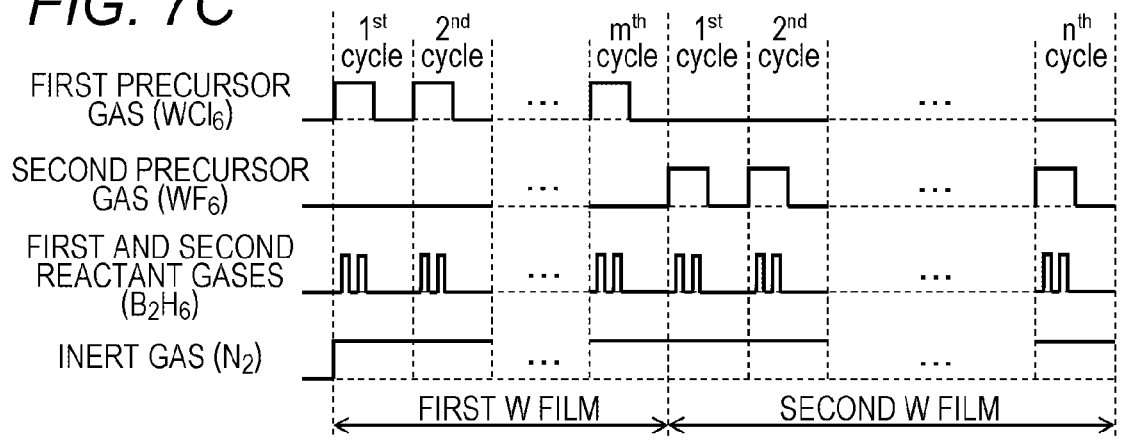

In the above-described embodiment, the example in which the process of supplying the $WCl_6$ gas and the process of supplying $B_2H_6$ gas are alternately performed a predetermined number of times (m times) in the first W film forming process has been described, but the present invention is not limited thereto. For example, as illustrated in FIG. 6A, the supplying of the $B_2H_6$ gas may be continuously performed, and the supplying of the $WCl_6$ gas may be intermittently performed twice or more (m times) therebetween. Also, for example, as illustrated in FIG. 6B, the supplying of the $WCl_6$ gas may be continuously performed, and the supplying of the $B_2H_6$ gas may be intermittently performed twice or more (m times) therebetween. Also, for example, as illustrated in FIG. 7, the supplying of the $WCl_6$ gas and the supplying of the $B_2H_6$ gas are intermittently performed twice or more therebetween. At this time, while one selected from the group consisting of the $WCl_6$ gas and the $B_2H_6$ gas is being supplied, the supplying of the other gas may be intermittently performed a predetermined number of times. FIG. 7A illustrates an example in which the supplying of the $WCl_6$ gas is intermittently performed a predetermined number of times (m times) and the supplying of the $B_2H_6$ gas is intermittently performed once during the supplying of the $WCl_6$ gas. FIG. 7B illustrates an example in which the supplying of the $B_2H_6$ gas is intermittently performed a predetermined number of times (m times) and the supplying of the $WCl_6$ gas is intermittently performed once during the supplying of the $B_2H_6$ gas. FIG. 7C illustrates an example in which the supplying of the $WCl_6$ gas is intermittently performed a predetermined number of times (m times) and the supplying of the $B_2H_6$ gas is intermittently performed twice during the supplying of the $WCl_6$ gas. The processing condition at this time can be the same processing condition as the film-forming sequence described with reference to FIGS. 4 and 5A.

As such, in the first W film forming process, the same effect as the above-described embodiment can be obtained by overlapping the supply period of the $B_2H_6$ gas with a part of the supply period of the $WCl_6$ gas or overlapping the supply period of the $WCl_6$ gas with a part of the supply period of the $B_2H_6$ gas. Also, in a case where a part of the supply period of the gas is overlapped, the deposition rate of the first W film can be improved as compared with a case where the supply periods are alternately performed without being overlapped. As a result, the total deposition rate of the W film obtained by the first W film and the second W film being laminated can be improved. However, as in the film-forming sequence illustrated in FIG. 5A, the supplying of the $WCl_6$ and the supplying of the $B_2H_6$ gas are alternately performed, with the removal of the residual gas from the process chamber 201 being interposed therebetween, which is preferable in that the $WCl_6$ gas and the $B_2H_6$ gas can appropriately react under the condition that the surface reaction is dominant and the controllability of the film thickness control and the step coverage can be increased. Also, it is preferable in that it is possible to prevent the gas-phase reaction between the $WCl_6$ and the $B_2H_6$ gas within the process chamber 201 and it is possible to prevent particles from occurring within the process chamber 201.

Modification 3

In the above-described embodiment, the example in which the process of supplying the $WF_6$ gas and the process of supplying $B_2H_6$ gas are alternately performed a predetermined number of times (n times) in the second W film forming process has been described, but the present invention is not limited thereto.

For example, as illustrated in FIG. 6A, the supplying of the $B_2H_6$ gas may be continuously performed, and the supplying of the $WF_6$ gas may be intermittently performed twice or more (n times) therebetween. Also, for example, as illustrated in FIG. 6B, the supplying of the $WF_6$ gas may be continuously performed, and the supplying of the $B_2H_6$ gas may be intermittently performed twice or more (n times) therebetween. Also, for example, as illustrated in FIGS. 7A to 7C, the supplying of the $WF_6$ gas and the supplying of the $B_2H_6$ gas are intermittently performed twice or more therebetween. At this time, while one of the $WF_6$ gas or the $B_2H_6$ gas is being supplied, the supplying of the other gas may be intermittently performed a predetermined number of times. FIG. 7A illustrates an example in which the supplying of the $WF_6$ gas is intermittently performed a predetermined number of times (n times) and the supplying of the $B_2H_6$ gas is intermittently performed once during the supplying of the $WF_6$ gas. FIG. 7B illustrates an example in which the supplying of the $B_2H_6$ gas is intermittently performed a predetermined number of times (n times) and the supplying of the $WF_6$ gas is intermittently performed once during the supplying of the $B_2H_6$ gas. FIG. 7C illustrates an example in which the supplying of the $WF_6$ gas is intermittently performed a predetermined number of times (n times) and the supplying of the $B_2H_6$ gas is intermittently performed twice during the supplying of the $WF_6$ gas. The processing condition at this time can be the same processing condition as the film-forming sequence described with reference to FIGS. 4 and 5A.

As such, in the second W film forming process, the same effect as the above-described embodiment can be obtained by overlapping the supply period of the $B_2H_6$ gas with a part of the supply period of the $WF_6$ gas or overlapping the supply period of the $WF_6$ gas with a part of the supply period of the $B_2H_6$ gas. Also, in a case where a part of the supply period of the gas is overlapped, the deposition rate of the second W film can be improved as compared with a case where the supply period is alternately performed without being overlapped. As a result, the total deposition rate of the W film obtained by the first W film and the second W film being laminated can be improved. However, as in the film-forming sequence illustrated in FIG. 5A, the supplying of the $WF_6$ gas and the supplying of the $B_2H_6$ gas are alternately performed, with the removal of the residual gas from the process chamber 201 being interposed therebetween, which is preferable in that the $WF_6$ gas and the $B_2H_6$ gas can appropriately react under the condition that the surface reaction is dominant and the controllability of the film thickness control and the step coverage can be increased. Also, it is preferable in that it is possible to prevent the gas-phase reaction between the $WF_6$ and the $B_2H_6$ gas within the process chamber 201 and it is possible to prevent particles from occurring within the process chamber 201.

Modification 4

In the above-described embodiment, the example in which the first W film and the second W film are formed by the alternately supply method of alternately supplying the precursor gas and the reactant gas has been described, but the present invention is not limited to the above example.

Figure 8A:
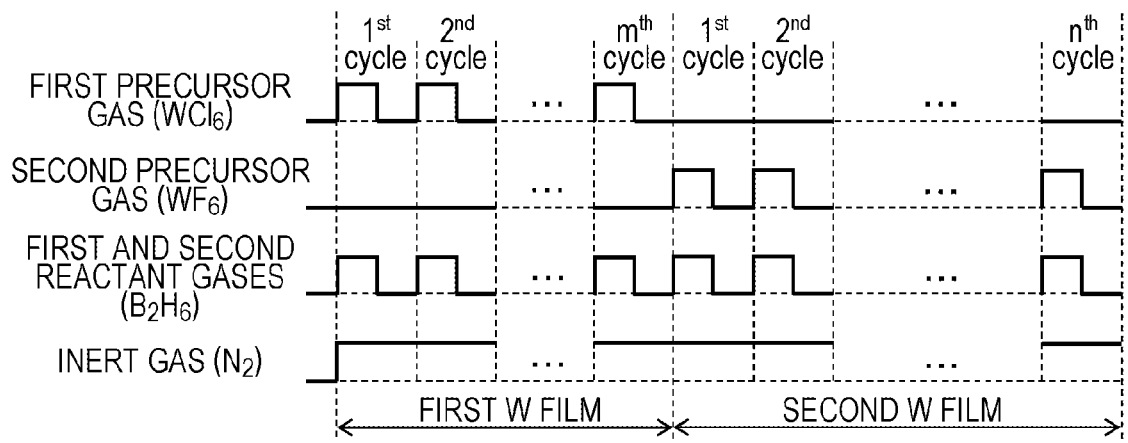
FIGS. 8A and 8B are diagrams illustrating film-forming flows of film-forming sequences according to another embodiment of the present invention, respectively.
Figure 8B:
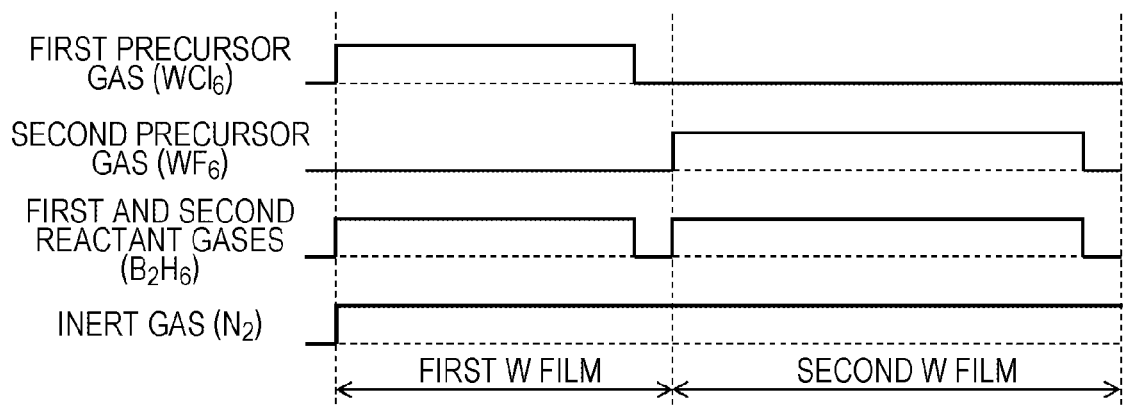

For example, as illustrated in FIG. 8A, the first W film may be formed by a simultaneous supply method of simultaneously performing the process of supplying the $WCl_6$ gas and the process of supplying the $B_2H_6$ gas twice or more (m times), and the second W film may be formed by a simultaneous supply method of simultaneously performing the process of supplying the $WF_6$ gas and the process of supplying the $B_2H_6$ gas twice or more (n times). Also, as illustrated in FIG. 8B, the first W film may be formed by a simultaneous supply method of simultaneously performing the process of supplying the $WCl_6$ gas and the process of supplying the $B_2H_6$ gas once, and the second W film may be formed by a simultaneous supply method of simultaneously performing the process of supplying the $WF_6$ gas and the process of supplying the $B_2H_6$ gas once. The processing condition at this time can be the same processing condition as the film-forming sequence described with reference to FIGS. 4 and 5A.

As such, in the first W film forming process and the second W film forming process, the same effect as the above-described embodiment can be obtained even when the reactant gas is simultaneously supplied at the same time as the supply period of the precursor gas, that is, the supply periods of these gases are overlapped. Also, in a case where the supply periods of the gases are overlapped, the deposition rates of the first W film and the second W film can be improved as compared with a case where the supply periods are alternately performed without being overlapped. As a result, the total deposition rate of the W film obtained by the first W film and the second W film being laminated can be improved. However, as in the film-forming sequence illustrated in FIG. 5A, the supplying of the precursor and the supplying of the reactant gas are alternately performed, with the removal of the residual gas from the process chamber 201 being interposed therebetween, which is preferable in that the precursor gas and the reactant gas can appropriately react under the condition that the surface reaction is dominant and the controllability of the film thickness control and the step coverage can be increased. Also, it is preferable in that it is possible to prevent the gas-phase reaction between the precursor and the reactant gas within the process chamber 201 and it is possible to prevent particles from occurring within the process chamber 201.

Modification 5

The film-forming sequences illustrated in FIGS. 5A to 8B can be arbitrarily combined. That is, the first W film forming process illustrated in any of the film-forming sequences illustrated in FIGS. 5A, 5B, 6A, 6B, 7A to 7C, 8A, and 8B and the second W film forming process illustrated in any of the film-forming sequences illustrated in FIGS. 5A, 5B, 6A, 6B, 7A to 7C, 8A, and 8B can be arbitrarily combined. The processing condition at this time can be the same processing condition as the film-forming sequence described with reference to FIGS. 4 and 5A.

For example, the W film obtained by the first W film and the second W film being laminated on the wafer 200 may be formed by performing the combination of the first W film forming process of the film-forming sequence illustrated in FIG. 5A and the second W film forming process of the film-forming sequence illustrated in FIG. 6A. Also, for example, the W film obtained by the first W film and the second W film being laminated on the wafer 200 may be formed by performing the combination of the first W film forming process of the film-forming sequence illustrated in FIG. 5A and the second W film forming process of the film-forming sequence illustrated in FIG. 8A. In these cases, the total deposition rate of the W film can be increased as compared with the case of forming the W film obtained by the first W film and the second W film being laminated by the film-forming sequence illustrated in FIG. 5A. Also, the controllability of the film thickness control and the step coverage of the W film can be totally increased as compared with the case of forming the W film obtained by the first W film and the second W film being laminated by the film-forming sequence illustrated in FIG. 6A or 8A.

Modification 6

In the above-described embodiment, the example in which the first reactant gas and the second reactant gas are the same type of gas (gas having the same chemical structure) has been described, but the present invention is not limited to the above example. That is, the first reactant gas and the second reactant gas may be different types of gases (gases having different chemical structures). For example, inorganic hydrogen-containing gas, such as inorganic borane-based gas, inorganic silane-based gas, or $H_2$ gas may be used as the first reactant gas, and other types of gases different from that may be used as the second reactant gas.

The types of the reactant gases used in the first W film forming process and the second W film forming process, or the film-forming sequences used in each process can be appropriately selected according to the type of the precursor gas, the temperature of the wafer 200, and the characteristic of the film to be formed.

For example, in a case where the $WCl_6$ gas is used as the first precursor gas, it is preferable that the inorganic silane-based gas such as $Si_2H_6$ and the $H_2$ gas are used as the first reactant gas because an appropriate reaction can occur, as compared with the case where the inorganic borane-based gas such as $B_2H_6$ is used as the first reactant gas.

In particular, in a case where the $WCl_6$ gas is used as the first precursor gas, when the $Si_2H_6$ gas is used as the first reactant gas, the first W film can be easily formed under non-plasma atmosphere, as compared with the case where the $B_2H_6$ gas is used as the first reactant gas. In this case, the first W film can be formed even when the process of supplying the $WCl_6$ gas and the process of supplying $Si_2H_6$ gas are alternately performed and even when these processes are simultaneously performed. However, in the case where these processes are alternately performed, a more appropriate reaction can occur, as compared with the case where these processes are simultaneously performed.

Also, in a case where the $WCl_6$ gas is used as the first precursor gas, when the $H_2$ gas is used as the first reactant gas, the first W film can be easily formed under non-plasma atmosphere, as compared with the case where the $B_2H_6$ gas is used as the first reactant gas. In this case, when the process of supplying the $WCl_6$ gas and the process of supplying the $H_2$ gas are simultaneously performed, a more appropriate reaction can occur, as compared with the case where these processes are alternately performed. However, in the case where the $H_2$ gas is used as the first reactant gas, since the temperature of the wafer 200 needs to be increased and the base of the film formation, that is, the based film of the surface of the wafer 200, is damaged by Cl, it is apprehended that the reliability of the semiconductor device will be degraded, as compared with the case where the $Si_2H_6$ gas is used as the first reactant gas.

Also, for example, in a case where the $WF_6$ gas is used as the second precursor gas, inorganic borane-based gas such as $B_2H_6$ gas, inorganic silane-based gas such as $Si_2H_6$, and $H_2$ gas can be preferably used as the second reactant gas.

In a case where the $WF_6$ gas is used as the second precursor gas and the $Si_2H_6$ gas is used as the second reactant gas, the second W film can be easily formed under non-plasma atmosphere, as in the case where the $B_2H_6$ gas is used as the second reactant gas. In this case, the second W film can be formed even when the process of supplying the $WF_6$ gas and the process of supplying $Si_2H_6$ gas and $B_2H_6$ gas are alternately performed and even when these processes are simultaneously performed. Also, in the case where these processes are alternately performed, a more appropriate reaction can occur, as compared with the case where these processes are simultaneously performed.

Also, in a case where the $WF_6$ gas is used as the second precursor gas and the $H_2$ gas is used as the second reactant gas, the second W film can be easily formed under non-plasma atmosphere, as in the case where the $B_2H_6$ gas is used as the second reactant gas. In this case, when the process of supplying the $WF_6$ gas and the process of supplying the $H_2$ gas are simultaneously performed, a more appropriate reaction can occur, as compared with the case where these processes are alternately performed.

The resistivity of the W film is increased in order of the case where the $H_2$ gas is used as the reactant gas, the case where the $B_2H_6$ gas is used, and the case where the $Si_2H_6$ gas. That is, the resistivity of the W film is lowest (smallest) when the $H_2$ gas is used as the reactant gas. That is, the use of the $H_2$ gas as the second reactant gas can reduce the total resistivity of the W film obtained by the first W film and the second W film being laminated. Also, the use of the $H_2$ gas as the first reactant gas and the second reactant gas can further reduce the total resistivity of the W film obtained by the first W film and the second W film being laminated.

However, in a case where the $WF_6$ gas is used as the second precursor gas and the $H_2$ gas is used as the second reactant gas, it may be difficult to form the film according to the type of the base film (TiN, SiO, Si, etc.) in a low-temperature region of, for example, 200 to 250° C. In this regard, for example, in a case where the first W film formed by these reactions using the $WCl_6$ gas as the first precursor gas and the $Si_2H_6$ gas as the first reactant gas is the base film, the second W film can be formed even in the low-temperature region by using the $WF_6$ gas as the second precursor gas and the $H_2$ gas as the second reactant gas. Also, at this time, even when a trench having an aspect ratio of, for example, about 10, is formed in the base of the surface of the wafer 200, the first W film and the second W film can be continuously formed and good step coverage (practical level) can be obtained.

When forming the W film having low resistivity without increasing the temperature of the wafer 200, the W film obtained by the first W film and the second W film being laminated can be effectively formed by performing: the process of forming the first W film on the wafer 200 by performing, a predetermined number of times, supplying $WCl_6$ gas as the first precursor gas to the wafer 200 and supplying $Si_2H_6$ gas as the first reactant gas to the wafer 200; and the process of forming the second film on the first W film by performing, simultaneously, supplying $WF_6$ gas as the second precursor gas to the wafer 200 and supplying $H_2$ gas as the second reactant gas to the wafer 200.

Modification 7

Also, in the above-described embodiment, the example in which the film containing W being a transition metal element is formed has been described. However, the present invention is not limited to the above-described embodiment. For example, the present invention can be preferably applied even in the case of forming a metal-based thin film including a transition metal element, such as titanium (Ti), molybdenum (Mo), tantalum (Ta), ruthenium (Ru), or hafnium (Hf), and a typical metal element, such as aluminum (Al).

For example, in a case where a Ti film essentially consisting of Ti is formed as a Ti-containing film, gas containing Ti and a chloro group (Cl) (chlorotitanium-based gas) such as titanium tetrachloride ($TiCl_4$) can be used as the first precursor gas, and gas containing Ti and a fluoro group (F) (fluorotitanium-based gas) such as titanium tetrafluoride ($TiF_4$) can be used as the second precursor gas. Also, in addition to the reactant gas described in the above embodiment, gas containing Ti and an amino group (amino titanium-based gas) such as tetrakis ethylmethyl amino titanium ($Ti[N(C_2H_5)(CH_3)]_4$, abbreviated to TEMAT) can be used as the first reactant gas and the second reactant gas. The processing condition at this time can be the same as, for example, the processing condition of the above-described embodiment.

Also, for example, in a case where a Mo film essentially consisting of Mo is formed as a Mo-containing film, gas containing Mo and a chloro group (chloromolybdenum-based gas) such as molybdenum penta chloride ($MoCl_5$) can be used as the first precursor gas, and gas containing Mo and a fluoro group (fluoromolybdenum-based gas) such as molybdenum penta fluoride ($MoF_5$) can be used as the second precursor gas. Also, in addition to the reactant gas described in the above embodiment, gas containing Mo and an amino group (amino molybdenum-based gas) can be used as the first reactant gas and the second reactant gas. The processing condition at this time can be the same as, for example, the processing condition of the above-described embodiment.

Also, for example, in a case where a Ta film essentially consisting of Ta is formed as a Ta-containing film, gas containing Ta and a chloro group (chlorotantalum-based gas) such as tantalum penta chloride ($TaCl_5$) can be used as the first precursor gas, and gas containing Ta and a fluoro group (fluorotantalum-based gas) such as tantalum penta fluoride ($TaF_5$) can be used as the second precursor gas. Also, in addition to the reactant gas described in the above embodiment, gas containing Ta and an amino group (amino tantalum-based gas) can be used as the first reactant gas and the second reactant gas. The processing condition at this time can be the same as, for example, the processing condition of the above-described embodiment.

Also, for example, in a case where a Ru film essentially consisting of Ru is formed as a Ru-containing film, gas containing Ru and a chloro group (chlororuthenium-based gas) such as ruthenium trichloride ($RuCl_3$) can be used as the first precursor gas, and gas containing Ru and a fluoro group (fluororuthenium-based gas) such as ruthenium trifluoride ($RuF_3$) can be used as the second precursor gas. Also, in addition to the reactant gas described in the above embodiment, gas containing Ru and an amino group (amino ruthenium-based gas) can be used as the first reactant gas and the second reactant gas. The processing condition at this time can be the same as, for example, the processing condition of the above-described embodiment.

Also, for example, in a case where a Hf film essentially consisting of Hf is formed as a Hf-containing film, gas containing Hf and a chloro group (chlorohafnium-based gas) such as hafnium tetrachloride ($HfCl_4$) can be used as the first precursor gas, and gas containing Hf and a fluoro group (fluorohafnium-based gas) such as hafnium tetrafluoride ($HfF_4$) can be used as the second precursor gas. Also, in addition to the reactant gas described in the above embodiment, gas containing Hf and an amino group (amino hafnium-based gas) such as tetrakis ethylmethyl amino hafnium ($Hf[N(C_2H_5)(CH_3)]_4$, abbreviated to TEMAH) can be used as the first reactant gas and the second reactant gas. The processing condition at this time can be the same as, for example, the processing condition of the above-described embodiment.

Also, for example, in a case where an Al film essentially consisting of Al is formed as an Al-containing film, gas containing Al and a chloro group (chloroaluminum-based gas) such as aluminum trichloride ($AlCl_3$) can be used as the first precursor gas, and gas containing Al and a fluoro group (fluoroaluminum-based gas) such as aluminum trifluoride ($AlF_3$) can be used as the second precursor gas. Also, in addition to the reactant gas described in the above embodiment, organic aluminum-based gas such as trimethyl aluminum ($Al(CH_3)_3$, abbreviated to TMA) can be used as the first reactant gas and the second reactant gas. The processing condition at this time can be the same as, for example, the processing condition of the above-described embodiment.

As such, the present invention can be applied to the formation of not only the W film containing the transition metal element but also the film containing the metal element such as the transition metal element other than W and the typical metal element. In this case, the same effect as the above-described embodiment can be obtained.

Modification 8

In the above-described embodiment, the example in which the W film essentially consisting of W is formed on the wafer 200 as the substrate, that is, the example in which the film containing the metal element as the main component, has been described, but the present invention is not limited to the above example. For example, the present invention can also be preferably applied to a case where a tungsten nitride film (WN film), a tungsten oxide film (WO film), a tungsten oxynitride film (WON film), or a tungsten-titanium alloy film (WTi film) is formed on the wafer 200 as the W-containing film. The WN film, the WO film, the WON film, and the WTi film are all the conductive metal films.

For example, in a case where the metal nitride film such as the WN film is formed on the wafer 200, a cycle is performed a predetermined number of time in at least one selected from the group consisting of the process of forming the first film and the process of forming the second film, the cycle further including supplying nitriding gas, that is, nitrogen-containing gas, for example, ammonia ($NH_3$), to the wafer 200, in addition to supplying the precursor gas to the wafer 200 and supplying the reactant gas to the wafer 200. The supply flow rate of the $NH_3$ gas can be set to a flow rate of a range of, for example, 100 to 1000 sccm. The other processing conditions can be the same processing conditions as the film-forming sequence described with reference to FIGS. 4 and 5A.

For example, in a case where the metal oxide film such as the WO film is formed on the wafer 200, a cycle is performed a predetermined number of time in at least one selected from the group consisting of the process of forming the first film and the process of forming the second film, the cycle further including supplying oxidizing gas, that is, oxygen-containing gas, for example, oxygen ($O_2$), to the wafer 200, in addition to supplying the precursor gas to the wafer 200 and supplying the reactant gas to the wafer 200. The supply flow rate of the $O_2$ gas can be set to a flow rate of a range of, for example, 100 to 1000 sccm. The other processing conditions can be the same processing conditions as the film-forming sequence described with reference to FIGS. 4 and 5A.

For example, in a case where the metal oxynitride film such as the WON film is formed on the wafer 200, a cycle is performed a predetermined number of time in at least one selected from the group consisting of the process of forming the first film and the process of forming the second film, the cycle further including supplying nitrogen-containing gas, for example, $NH_3$ gas, to the wafer 200, and supplying oxygen-containing gas, for example, $O_2$ gas, to the wafer 200, in addition to supplying the precursor gas to the wafer 200 and supplying the reactant gas to the wafer 200. The supply flow rate of each of the $NH_3$ gas and the $O_2$ gas can be set to a flow rate of a range of, for example, 100 to 1000 sccm. The other processing conditions can be the same processing conditions as the film-forming sequence described with reference to FIGS. 4 and 5A.

For example, in a case where the metal alloy film such as the WTi film is formed on the wafer 200, a cycle is performed a predetermined number of time in at least one selected from the group consisting of the process of forming the first film and the process of forming the second film, the cycle further including supplying, for example, $TiCl_4$ gas as precursor gas containing other metal element, to the wafer 200, in addition to supplying the precursor gas to the wafer 200 and supplying the reactant gas to the wafer 200. Also, for example, in the film-forming sequence of FIG. 5B, the WTi film can be formed even when the $TiCl_4$ gas is used instead of the $WCl_6$ gas. The supply flow rate of the $TiCl_4$ gas can be set to a flow rate of a range of, for example, 100 to 2000 sccm. The other processing conditions can be the same processing conditions as the film-forming sequence described with reference to FIGS. 4 and 5A.

In addition to the $NH_3$ gas, for example, diazene ($N_2H_2$) gas, hydrazine ($N_2H_4$) gas, or $N_3H_8$ gas can be used as the nitrogen-containing gas. The nitrogen-containing gas acts as an N source (nitrogen source) when the metal nitride film or the metal oxynitride film is formed. In addition to the $O_2$ gas, for example, nitrous oxide ($N_2O$) gas, nitric oxide (NO) gas, nitrogen dioxide ($NO_2$) gas, ozone ($O_3$) gas, hydrogen ($H_2$) gas+$O_2$ gas, $H_2$ gas+$O_3$ gas, water vapor ($H_2O$) gas, carbon monoxide (CO) gas, or carbon dioxide ($CO_2$) gas can be used as the oxygen-containing gas. The oxygen-containing gas acts as an O source (oxygen source) when the metal oxide film or the metal oxynitride film is formed. In addition to the $TiCl_4$ gas, $TiF_4$ gas or the like can be used as precursor gas containing other metal element. The precursor gas containing other metal element acts as a metal source when the metal alloy film is formed.

It is preferable that the process recipes used to form the thin film described above (program in which processing sequence or processing condition is described) are separately prepared according to the contents of the substrate processing (type of a film to be formed, a combination ratio, film quality, film thickness, etc.) It is preferable that, when the substrate processing is started, a suitable process recipe is appropriately selected from the plurality of process recipes according to the contents of the substrate processing. Specifically, it is preferable that the plurality of process recipes separately prepared according to the contents of the substrate processing is previously stored (installed) in the memory device 121c provided in the substrate processing apparatus through the telecommunication line or the non-transitory computer-readable recording medium (external memory device 123) storing the relevant process recipe. It is preferable that, when the substrate processing is started, the CPU 121a provided in the substrate processing apparatus appropriately selects a suitable process recipe from the plurality of process recipes stored in the memory device 121c according to the contents of the substrate processing. Due to such a configuration, films of various film types, composition ratios, film quality, film thickness can be formed for general purposes and with good reproducibility by a single substrate processing apparatus. Since the workload of an operator (input/output load of the processing sequence or processing conditions) can be reduced. Therefore, erroneous processes can be prevented and the substrate processing can be quickly started.

The above-described process recipe is not limited to a case that newly creates a process recipe. For example, the process recipe may be prepared by modifying an existing process recipe having been installed on the substrate processing apparatus. When the process recipe is modified, the modified process recipe may be installed on the substrate processing apparatus through the telecommunication line or the non-transitory computer-readable recording medium storing the relevant process recipe. Also, an existing process recipe having been installed on the substrate processing apparatus may be directly modified by operating the input/output device 122 provided in the existing substrate processing apparatus.

In the above-described embodiments, the example in which the thin film is formed using a batch type substrate processing apparatus that processes a plurality of sheets of substrates at a time has been described. However, the present invention is not limited to the above-described embodiments. For example, the present invention can be preferably applied to a case in which a thin film is formed using a single wafer type substrate processing apparatus that processes a single substrate at a time. Also, in the above-described embodiments, the example in which the thin film is formed using a substrate processing apparatus including hot wall type processing furnace has been described. However, the present invention is not limited to the above-described embodiments. For example, the present invention can be preferably applied to a case in which a thin film is formed using a substrate processing apparatus including cold wall type processing furnace. In these cases, the processing condition can be the same as, for example, the processing condition of the above-described embodiment.

The respective embodiments or the respective modifications can be appropriately combined. Also, the processing condition at this time can be the same as, for example, the processing condition of the above-described embodiment.

Preferred Aspects of Present Invention

Preferred aspects of the present invention will be additionally stated.

Supplementary Note 1

According to an aspect of the present invention, there is provided a method of manufacturing a semiconductor device, including: (a) forming a first film containing a metal element on a substrate by performing a cycle a predetermined number of times, the cycle including: (a-1) supplying a first precursor gas being a fluorine-free inorganic gas containing the metal element to the substrate; and (a-2) supplying a first reactant gas having reducibility to the substrate; (b) forming a second film containing the metal element on the first film by performing a cycle a predetermined number of times, the cycle including: (b-1) supplying a second precursor gas containing the metal element and fluorine to the substrate; and (b-2) supplying a second reactant gas having reducibility to the substrate; and (c)

forming a film containing the metal element and obtained by the first film and the second film being laminated on the substrate by performing the (a) and (b).

Supplementary Note 2

In the method according to Supplementary Note 1, preferably, the first precursor gas contains the metal element and chlorine (chloro group).

Supplementary Note 3

In the method according to Supplementary Note 1 or 2, preferably, the first precursor gas contains the metal element and is fluorine (fluoro group)-free, carbon-free, and oxygen-free.

Supplementary Note 4

In the method according to any of Supplementary Notes 1 to 3, preferably, the first precursor gas contains the metal element and is fluorine (fluoro group)-free, carbon-free, nitrogen-free, hydrogen-free, and oxygen-free Supplementary Note 5

In the method according to any of Supplementary Notes 1 to 4, preferably, at least one selected from the group consisting of the first reactant gas and the second reactant gas includes hydrogen-containing gas.

Supplementary Note 6

In the method according to any of Supplementary Notes 1 to 5, preferably, at least one selected from the group consisting of the first reactant gas and the second reactant gas contains the metal element and an amino group. The first reactant gas and the second reactant gas may be the same gas (gas having the same chemical structure) or may be different types of gases (gases having different chemical structures).

Supplementary Note 7

In the method according to any of Supplementary Notes 1 to 6, preferably, the forming of the first film and the forming of the second film are performed in a same process chamber in a state in which a temperature of the substrate is set to a same temperature.

Supplementary Note 8

In the method according to any of Supplementary Notes 1 to 7, preferably, the first film is formed on at least one selected from the group consisting of a silicon-containing film, a metal oxide film, and a metal nitride film.

Supplementary Note 9

In the method according to any of Supplementary Notes 1 to 8, preferably, a thickness of the first film is one atomic layer or more and 15 nm or less, preferably 1 nm or more and 15 nm or less, and more preferably 5 nm or more and 10 nm or less.

Supplementary Note 10

In the method according to any of Supplementary Notes 1 to 9, preferably, the method further includes performing heat treatment to the first film and the second film that are formed on the substrate.

Supplementary Note 11

In the method according to any of Supplementary Notes 1 to 10, preferably, the supplying of the first precursor gas and the supplying of the first reactant gas are alternately performed a predetermined number of times (once or more) in the forming of the first film.

Supplementary Note 12

In the method according to any of Supplementary Notes 1 to 10, preferably, the supplying of at least one selected from the group consisting of the first precursor gas and the first reactant gas is intermittently performed (twice or more) in the forming of the first film. For example, the supplying of the first precursor gas is continuously performed, and the supplying of the first reactant gas is intermittently performed twice or more therebetween. Also, for example, the supplying of the first reactant gas is continuously performed, and the supplying of the first precursor gas is intermittently performed twice or more therebetween. Also, for example, the supplying of the first precursor gas and the supplying of the first reactant gas are intermittently performed twice or more therebetween. At this time, while one of the first precursor gas or the first reactant gas is being supplied, the supplying of the other gas is intermittently performed a predetermined number of times (once or more).

Supplementary Note 13

In the method according to any of Supplementary Notes 1 to 10, preferably, the supplying of the first precursor gas and the supplying of the first reactant gas are simultaneously performed a predetermined number of times (once or more) in the forming of the first film.

Supplementary Note 14

In the method according to any of Supplementary Notes 1 to 13, preferably, the supplying of the second precursor gas and the supplying of the second reactant gas are alternately performed a predetermined number of times (once or more) in the forming of the second film.

Supplementary Note 15

In the method according to any of Supplementary Notes 1 to 13, preferably, the supplying of at least one selected from the group consisting of the second precursor gas and the second reactant gas is intermittently performed (twice or more) in the forming of the second film. For example, the supplying of the second precursor gas is continuously performed, and the supplying of the second reactant gas is intermittently performed twice or more therebetween. Also, for example, the supplying of the second reactant gas is continuously performed, and the supplying of the second precursor gas is intermittently performed twice or more therebetween. Also, for example, the supplying of the second precursor gas and the supplying of the second reactant gas are intermittently performed twice or more therebetween. At this time, while one of the second precursor gas or the second reactant gas is being supplied, the supplying of the other gas is intermittently performed a predetermined number of times (once or more).

Supplementary Note 16

In the method according to any of Supplementary Notes 1 to 13, preferably, the supplying of the second precursor gas and the supplying of the second reactant gas are simultaneously performed a predetermined number of times (once or more) in the forming of the second film.

Supplementary Note 17

In the method according to any of Supplementary Notes 1 to 16, preferably, the film containing the metal element includes a film essentially consisting of the metal element (film containing the metal element as a main component).

Supplementary Note 18

According to another aspect of the present invention, there is provided a method of manufacturing a semiconductor device, including: (a) forming a first film containing a metal element on a substrate by performing a cycle a predetermined number of times, the cycle including: (a-1) supplying a first precursor gas being a fluorine-free inorganic gas containing the metal element to the substrate; and (a-2) supplying a first reactant gas having reducibility to the substrate; (b) forming a second film containing the metal element on the first film by performing a cycle a predetermined number of times, the cycle including: (b-1) supplying a second precursor gas containing the metal element and fluorine to the substrate; and (b-2) supplying a second reactant gas having reducibility to the substrate; and (c) forming a film containing the metal element and obtained by the first film and the second film being laminated on the substrate by performing the (a) and (b).

Supplementary Note 19

According to further another aspect of the present invention, there is provided a substrate processing apparatus including: a process chamber configured to accommodate a substrate; a first precursor gas supply system configured to supply a first precursor gas being a fluorine-free inorganic gas containing a metal element into the process chamber; a second precursor gas supply system configured to supply a second precursor gas containing the metal element and fluorine into the process chamber; a first reactant gas supply system configured to supply a first reactant gas having reducibility into the process chamber; a second reactant gas supply system configured to supply a second reactant gas having reducibility into the process chamber; and a controller configured to control the first precursor gas supply system, the second precursor gas supply system, the first reactant gas supply system, and the second reactant gas supply system so as to (a) form a first film containing the metal element on the substrate by performing a cycle a predetermined number of times, the cycle including: (a-1) supplying the first precursor gas to the substrate in the process chamber; and (a-2) supplying the first reactant gas to the substrate in the process chamber; (b) form a second film containing the metal element on the first film by performing a cycle a predetermined number of times, the cycle including: (b-1) supplying the second precursor gas to the substrate in the process chamber; and (b-2) supplying the second reactant gas to the substrate in the process chamber; and (c) form a film containing the metal element and obtained by the first film and the second film being laminated on the substrate by performing the (a) and (b).

Supplementary Note 20

According to an aspect of the present invention, there is provided a non-transitory computer-readable recording medium storing a program that causes a computer to perform: (a) a process of forming a first film containing a metal element on a substrate by performing a cycle a predetermined number of times, the cycle including: (a-1) supplying a first precursor gas being a fluorine-free inorganic gas containing the metal element to the substrate in a process chamber; and (a-2) supplying a first reactant gas having reducibility to the substrate in the process chamber; (b) a process of forming a second film containing the metal element on the first film by performing a cycle a predetermined number of times, the cycle including: (b-1) supplying a second precursor gas containing the metal element and fluorine to the substrate in the process chamber; and (b-2) supplying a second reactant gas having reducibility to the substrate in the process chamber; and (c) a process of forming a film containing the metal element and obtained by the first film and the second film being laminated on the substrate by performing the (a) and (b).

What is claimed is:
1. A method of manufacturing a semiconductor device, comprising:
   forming a film composed of a first film containing a metal element and a second film containing the metal element on a substrate, the first film and the second film being laminated, by performing:
   (a) forming the first film on the substrate by performing a first cycle a first predetermined number of times, the first cycle including:
      (a-1) supplying a first precursor gas being a fluorine-free inorganic gas containing the metal element to the substrate; and
      (a-2) supplying a first reactant gas to the substrate; and
   (b) forming the second film on the first film by performing a second cycle a second predetermined number of times, the second cycle including:
      (b-1) supplying a second precursor gas containing the metal element and fluorine to the substrate; and
      (b-2) supplying a second reactant gas to the substrate,
   wherein at least one of the first reactant gas or the second reactant gas includes a gas containing the metal element and an amino group or an inorganic hydrogen-containing gas.
2. The method according to claim 1, wherein one of the first reactant gas and the second reactant gas includes the gas containing the metal element and the amino group, and the other includes the inorganic hydrogen-containing gas.
3. The method according to claim 1, wherein each of the first reactant gas and the second reactant gas includes the gas containing the metal element and the amino group.
4. The method according to claim 1, wherein each of the first reactant gas and the second reactant gas includes the inorganic hydrogen-containing gas.

5. The method according to claim 1, wherein
the first precursor gas includes at least one selected from a group consisting of a chlorotungsten-based gas, a chlorotitanium-based gas, a chloromolybdenum-based gas, a chlorotantalum-based gas, a chlororuthenium-based gas, a chlorohafnium-based gas, and a chloroaluminum-based gas, the second reactant gas includes at least one selected from a group consisting of a fluorotungsten-based gas, a fluorotitanium-based gas, a fluoromolybdenum-based gas, a fluorotantalum-based gas, a fluororuthenium-based gas, a fluorohafnium-based gas, and a fluoroaluminum-based gas, and
at least one of the first reactant gas or the second reactant gas includes an amino tungsten-based gas, an amino titanium-based gas, an amino molybdenum-based gas, an amino tantalum-based gas, an amino ruthenium-based gas, an amino hafnium-based gas, and, an organic aluminum-based gas.

6. The method according to claim 1, wherein the first precursor gas includes a chlorotungsten-based gas, the second reactant gas includes a fluorotungsten-based gas, and at least one of the first reactant gas or the second reactant gas includes an amino tungsten-based gas or an inorganic hydrogen-containing gas.

7. The method according to claim 1, wherein a thickness of the first film is one atomic layer or more and 15 nm or less.

8. The method according to claim 1, wherein a thickness of the first film is 5 nm or more and 15 nm or less.

9. The method according to claim 1, wherein the first cycle is repeated twice or more and the second cycle is repeated twice or more.

10. The method according to claim 1, wherein the (a-1) and the (a-2) are alternately repeated once or more in the (a), the (b-1) and the (b-2) are alternately repeated once or more in the (b).

11. The method according to claim 1, wherein one of the first precursor gas and the first reactant gas is continuously supplied, and the other is intermittently supplied in the (a), and one of the second precursor gas and the second reactant gas is continuously supplied, and the other is intermittently supplied in the (b).

12. The method according to claim 1, wherein the first precursor gas contains the metal element and chlorine.

13. The method according to claim 1, wherein the first precursor gas contains the metal element and is fluorine-free, carbon-free, and oxygen-free.

14. The method according to claim 1, wherein the first precursor gas contains the metal element and is fluorine-free, carbon-free, nitrogen-free, hydrogen-free, and oxygen-free.

15. The method according to claim 1, wherein the (a) and the (b) are performed in a same process chamber in a state in which a temperature of the substrate is set to a same temperature.

16. The method according to claim 1, wherein the first film is formed on at least one selected from the group consisting of a silicon-containing film, a metal oxide film, and a metal nitride film.

17. The method according to claim 1, further comprising performing heat treatment to the first film and the second film that are formed on the substrate.

18. The method according to claim 1, wherein the film containing the metal element includes a film essentially consisting of the metal element.

19. A substrate processing apparatus comprising:
a process chamber configured to accommodate a substrate;
a first precursor gas supply system configured to supply a first precursor gas being a fluorine-free inorganic gas containing a metal element into the process chamber;
a second precursor gas supply system configured to supply a second precursor gas containing the metal element and fluorine into the process chamber;
a first reactant gas supply system configured to supply a first reactant gas into the process chamber;
a second reactant gas supply system configured to supply a second reactant gas into the process chamber; and
a controller configured to control the first precursor gas supply system, the second precursor gas supply system, the first reactant gas supply system, and the second reactant gas supply system so as to form a film composed of a first film containing the metal element and a second film containing the metal element on a substrate, the first film and the second film being laminated, by performing:
(a) forming the first film on the substrate by performing a first cycle a first predetermined number of times, the first cycle including:
(a-1) supplying the first precursor gas to the substrate in the process chamber; and
(a-2) supplying the first reactant gas to the substrate in the process chamber; and
(b) forming the second film on the first film by performing a second cycle a second predetermined number of times, the second cycle including:
(b-1) supplying the second precursor gas to the substrate in the process chamber; and
(b-2) supplying the second reactant gas to the substrate in the process chamber,
wherein at least one of the first reactant gas or the second reactant gas includes a gas containing the metal element and an amino group or an inorganic hydrogen-containing gas.

20. A non-transitory computer-readable recording medium storing a program that causes a computer to perform forming a film composed of a first film containing a metal element and a second film containing the metal element on a substrate, the first film and the second film being laminated, by performing:
(a) forming the first film on a substrate by performing a first cycle a first predetermined number of times, the first cycle including:
(a-1) supplying a first precursor gas being a fluorine-free inorganic gas containing the metal element to the substrate; and
(a-2) supplying a first reactant gas to the substrate; and
(b) forming the second film on the first film by performing a second cycle a second predetermined number of times, the second cycle including:
(b-1) supplying a second precursor gas containing the metal element and fluorine to the substrate; and
(b-2) supplying a second reactant gas to the substrate, wherein at least one of the first reactant gas or the second reactant gas includes a gas containing the metal element and an amino group or an inorganic hydrogen-containing gas.

* * * * *